US010515997B2

(12) United States Patent
Iguchi

(10) Patent No.: US 10,515,997 B2
(45) Date of Patent: Dec. 24, 2019

(54) MEMORY DEVICE AND METHOD FOR MANUFACTURING THE SAME

(71) Applicant: Toshiba Memory Corporation, Minato-ku, Tokyo (JP)

(72) Inventor: Tadashi Iguchi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/137,251

(22) Filed: Sep. 20, 2018

(65) Prior Publication Data

US 2019/0296080 A1 Sep. 26, 2019

(30) Foreign Application Priority Data

Mar. 21, 2018 (JP) ................................ 2018-053640

(51) Int. Cl.
*H01L 27/24* (2006.01)
*H01L 45/00* (2006.01)
*H01L 23/528* (2006.01)
*H01L 23/522* (2006.01)

(52) U.S. Cl.
CPC .......... *H01L 27/249* (2013.01); *H01L 23/528* (2013.01); *H01L 23/5226* (2013.01); *H01L 45/1233* (2013.01); *H01L 45/1253* (2013.01); *H01L 45/16* (2013.01)

(58) Field of Classification Search
CPC . H01L 27/249; H01L 23/5226; H01L 23/528; H01L 45/1233; H01L 45/1253; H01L 45/16
See application file for complete search history.

(56) References Cited

U.S. PATENT DOCUMENTS 8,338,956 B2 * 12/2012 Maeda .............. H01L 27/11573 257/773
9,449,870 B2 9/2016 Eun et al.
10,177,224 B1 * 1/2019 Park .................... H01L 29/0649
2011/0108907 A1 5/2011 Maeda
2011/0169071 A1 * 7/2011 Uenaka ................ H01L 27/105 257/326
2013/0032875 A1 * 2/2013 Yun .................. H01L 29/66833 257/324
2017/0170057 A1 6/2017 Huo
2017/0179028 A1 6/2017 Lee et al.

FOREIGN PATENT DOCUMENTS

JP 2011-100921 A1 5/2011

* cited by examiner

*Primary Examiner* — Mark W Tornow
(74) *Attorney, Agent, or Firm* — Foley & Lardner LLP

(57) ABSTRACT

A memory device according to an embodiment includes: a first conductive layer, a second conductive layer, a third conductive layer and a fourth conductive layer parallel to a first direction and a second direction perpendicular to the first direction, and stacked in a third direction perpendicular to the first direction; a first, electrode connected to the first conductive layer; a second electrode connected to the second conductive layer; a third electrode connected to the third conductive layer; and a fourth electrode connected to the fourth conductive layer. The third conductive layer and the fourth conductive layer are not provided between the first electrode and the second electrode. The fourth conductive layer is not provided between the second electrode and the third electrode. A region without the second conductive layer is provided between the second electrode and the third electrode.

7 Claims, 23 Drawing Sheets

100
101
102
103
104
105
106
107
108
109
110
111
112
113
114
115
116
301
302
303
304
305
306
307
308
309
310
311
312
313
314
315
316
130
140

MEMORY DEVICE AND METHOD FOR MANUFACTURING THE SAME

CROSS-REFERENCE TO RELATED APPLICATION

This application is based upon and claims the benefit of priority from Japanese Patent Application No. 2018-053640, filed on Mar. 21, 2018, the entire contents of which are incorporated herein by reference.

FIELD

Embodiments described herein relate generally to a memory device and a method for manufacturing the memory device.

BACKGROUND

A three-dimensional memory in which memory cells are three-dimensionally arranged has been put to practical use in order to increase the integrity of a memory device. In the three-dimensional memory, it is necessary to form contact electrodes for applying a voltage or a current to the stacked wiring layers.

The contact electrodes are connected to the wiring layers drawn from the memory cell array in a contact region provided in the periphery of the memory cell array. In a case in which the area of the contact region increases, the area of a chip increases, which is not preferable. In particular, in a case in which the number of stacked wiring layers increases with an increase in the integrity, the number of contact electrodes also increases. Therefore, it is preferable to reduce the area of the contact region.

DETAILED DESCRIPTION

Figure 1:
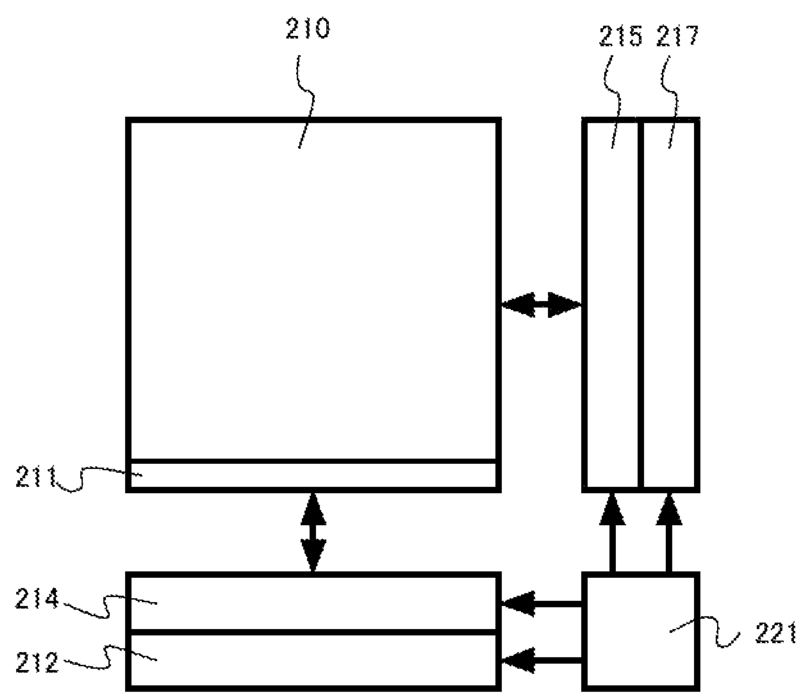
FIG. 1 is a block diagram illustrating a memory device according to an embodiment.

A memory device according to an embodiment includes: a first conductive layer parallel to a first direction and a second direction perpendicular to the first direction; a second conductive layer that is parallel to the first conductive layer and is located in a third direction perpendicular to the first direction and the second direction with respect to the first conductive layer; a third conductive layer that is parallel to the first conductive layer and is located in the third direction with respect to the second conductive layer; a fourth conductive layer that is parallel to the first conductive layer and is located in the third direction with respect to the third conductive layer; a first electrode that extends in the third direction and is connected to the first conductive layer; a second electrode that extends in the third direction and is connected to the second conductive layer; a third electrode that extends in the third direction and is connected to the third conductive layer, the second electrode being located between the first electrode and the third electrode; and a fourth electrode that extends in the third direction and is connected to the fourth conductive layer, the third electrode being located between the second electrode and the fourth electrode. The third conductive layer and the fourth conductive layer are not provided between the first electrode and the second electrode. The fourth conductive layer is not provided between the second electrode and the third electrode. A region without the second conductive layer is provided between the second electrode and the third electrode.

Hereinafter, embodiments of the invention will be described with reference to the drawings. In the following description, for example, the same or similar members are denoted by the same reference numerals and the description of the members that have been described once will not be repeated.

In the specification, the terms "lower portion" and "upper portion" are used for convenience. The terms "lower portion" and "upper portion" just indicate a relative positional relationship and do not define a positional relationship with respect to gravity.

Hereinafter, a memory device according to an embodiment will be described with reference to the drawings.

A memory device according to an embodiment includes: a first conductive layer parallel to a first direction and a second direction perpendicular to the first direction; a second conductive layer that is parallel to the first conductive layer and is located in a third direction perpendicular to the first direction and the second direction with respect to the first conductive layer; a third conductive layer that is parallel to the first conductive layer and is located in the third direction with respect to the second conductive layer; a fourth conductive layer that is parallel to the first conductive layer and is located in the third direction with respect to the third conductive layer; a first electrode that extends in the third direction and is connected to the first conductive layer; a second electrode that extends in the third direction and is connected to the second conductive layer; a third electrode that extends in the third direction and is connected to the third conductive layer, the second electrode being located between the first electrode and the third electrode; and a fourth electrode that extends in the third direction and is connected to the fourth conductive layer, the third electrode being located between the second electrode and the fourth electrode. The third conductive layer and the fourth conductive layer are not provided between the first electrode and the second electrode. The fourth conductive layer is not provided between the second electrode and the third electrode. A region without the second conductive layer is provided between the second electrode and the third electrode.

Figure 2:
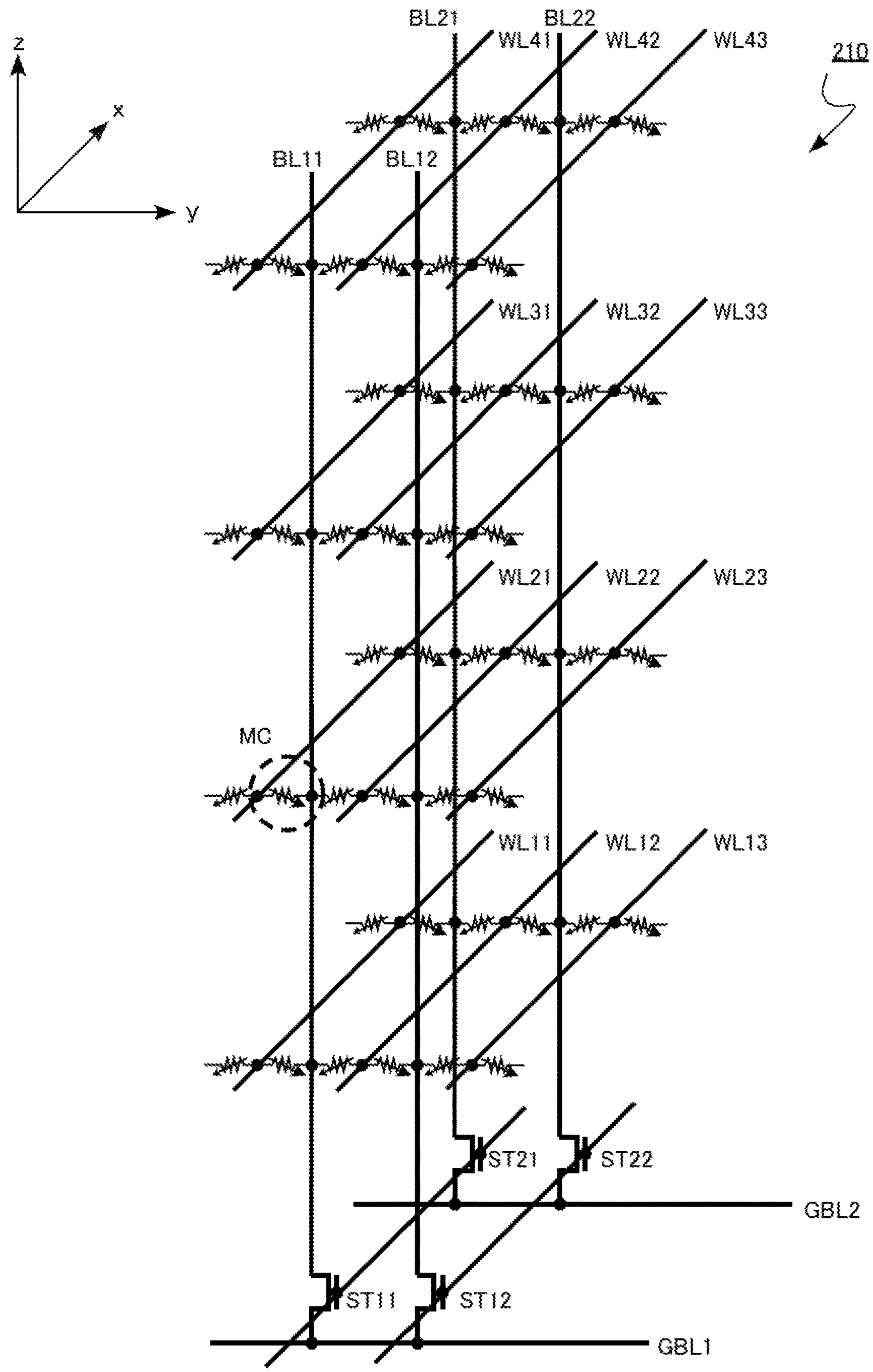
FIG. 2 is an equivalent circuit diagram illustrating a memory cell array according to the embodiment.

FIG. 1 is a block diagram illustrating the memory device according to the embodiment. FIG. 2 is an equivalent circuit diagram illustrating a memory cell array according to the embodiment. FIG. 2 schematically illustrates the wiring structure of the memory cell array.

The memory device according to the embodiment is a resistive random access memory (ReRAM). The memory cell array according to the embodiment has a three-dimensional structure in which memory cells MC are three-dimensionally arranged.

As illustrated in FIG. 1, the memory device includes a memory cell array 210, a contact region 211, a word line driver circuit 212, a row decoder circuit 214, a sense amplifier circuit 215, a column decoder circuit 217, and a control circuit 221.

As illustrated in FIG. 2, a plurality of memory cells MC are three-dimensionally arranged in the memory cell array 210. In FIG. 2, a region surrounded by a dashed line corresponds to one memory cell MC. The memory cell MC is a two-terminal resistance change element. The memory cell MC has a resistance change layer.

The memory cell array 210 includes, for example, a plurality of word lines WL (WL11, WL12, WL13, WL21, WL22, WL23, WL31, WL32, WL33, WL41, WL42, and WL43) and a plurality of bit lines BL (BL11, BL12, BL21, and BL22). The word line WL is an example of a first conductive line. The bit line BL is an example of a second conductive line.

The word line WL extends in the x direction (first direction). The bit line BL extends in the z direction (third direction). The word line WL and the bit line BL intersect each other at a right angle. The memory cell MC is provided at the intersection between the word line WL and the bit line BL. The region surrounded by the dashed line is one memory cell MC. The resistance change layer of the memory cell MC is provided between the word line WL and the bit line BL.

The plurality of word lines WL are electrically connected to the row decoder circuit 214. The contact region 211 is provided between the memory cell array 210 and the row decoder circuit 214. Contact electrodes for applying a current to the word lines WL are formed in the contact region 211.

The plurality of bit lines BL are electrically connected to the sense amplifier circuit 215. Selection transistors ST (ST11, ST21, ST12, and ST22) and global bit lines GBL (GBL1 and GBL2) are provided between the plurality of bit lines BL and the sense amplifier circuit 215. The global bit line GBL extends in the y direction (second direction).

The row decoder circuit 214 has a function of selecting the word line WL on the basis of an input row address signal. The word line driver circuit 212 has a function of applying a predetermined voltage to the word line WL selected by the row decoder circuit 214.

The column decoder circuit 217 has a function of selecting the bit line BL on the basis of an input column address signal. The sense amplifier circuit 215 has a function of applying a predetermined voltage to the bit line BL selected by the column decoder circuit 217. In addition, the sense amplifier circuit 215 has a function of detecting the current flowing between the selected word line WL and the selected bit line BL and amplifying the current.

The control circuit 221 has a function of controlling the word line driver circuit 212, the row decoder circuit 214, the sense amplifier circuit 215, the column decoder circuit 217, and other circuits (not illustrated).

Circuits, such as the word line driver circuit 212, the row decoder circuit 214, the sense amplifier circuit 215, the column decoder circuit 217, and the control circuit 221, include, for example, a transistor using a semiconductor layer (not illustrated) and a wiring layer.

Figure 3A:
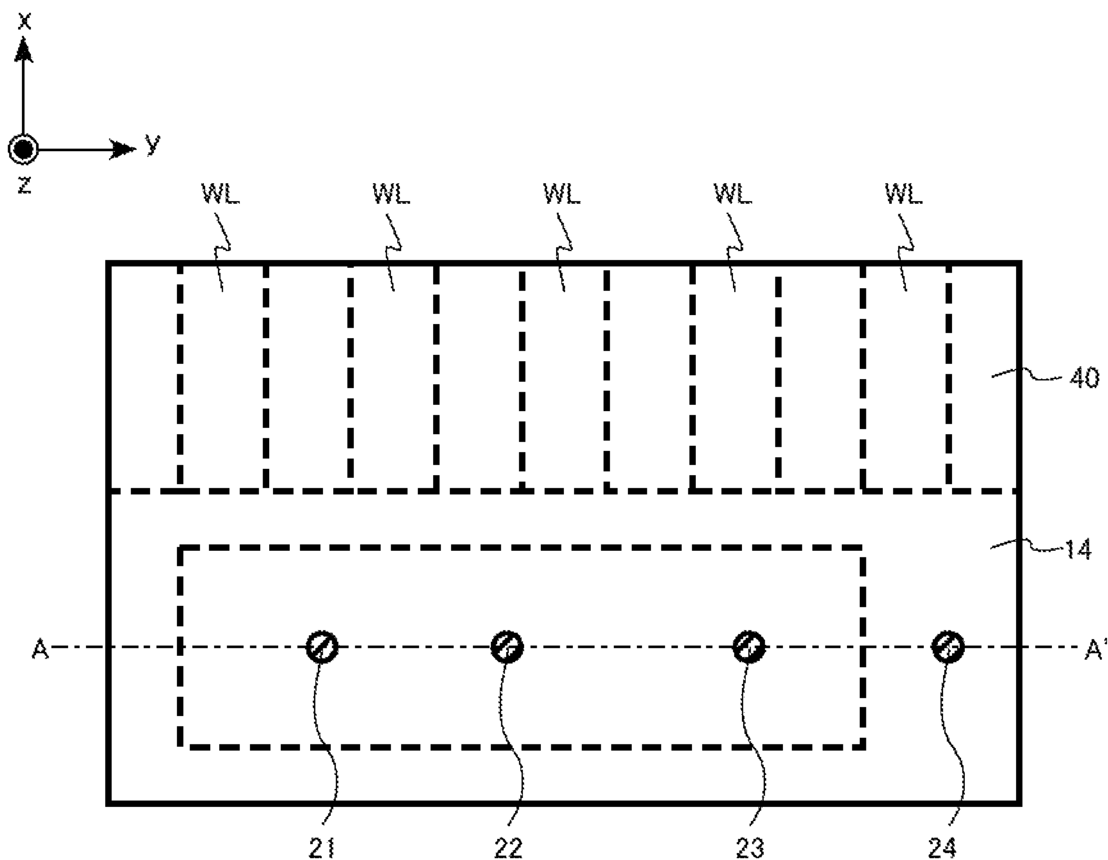
FIGS. 3A and 3B are diagrams schematically illustrating a contact region according to the embodiment.
Figure 3B:
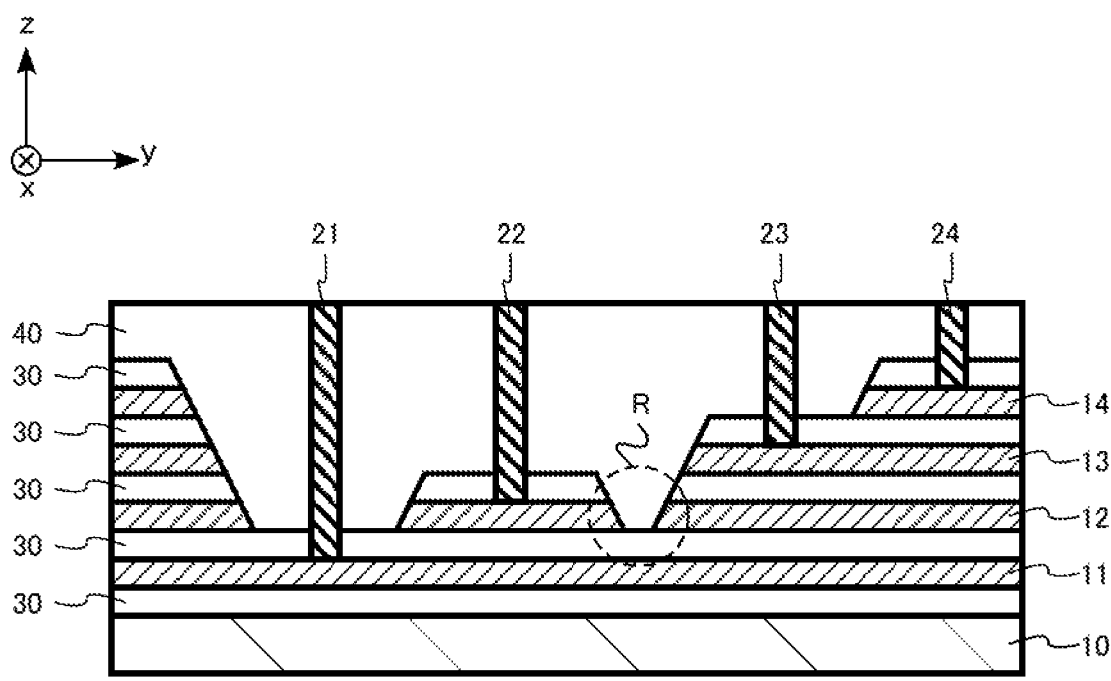

FIGS. 3A and 3B are diagrams schematically illustrating the contact region 211 according to the embodiment. FIG. 3A is a top view and FIG. 3B is a cross-sectional view. FIG. 3B is a cross-sectional view taken along the line AA' of FIG. 3A.

The contact region 211 includes a substrate 10, a first conductive layer 11, a second conductive layer 12, a third conductive layer 13, a fourth conductive layer 14, a first contact electrode 21 (first electrode), a second contact electrode 22 (second electrode), a third contact electrode 23 (third electrode), a fourth contact electrode 24 (fourth electrode), a first insulating layer 30 (insulating layer), a second insulating layer 40, and a plurality of word lines WL (first conductive lines).

The substrate 10 is, for example, a semiconductor substrate. The substrate 10 is, for example, a single-crystal silicon substrate.

The first conductive layer 11, the second conductive layer 12, the third conductive layer 13, and the fourth conductive layer 14 are parallel to the x direction (first direction) and the y direction (second direction). The first conductive layer 11, the second conductive layer 12, the third conductive layer 13, and the fourth conductive layer 14 have, for example, a plate shape.

The first conductive layer 11, the second conductive layer 12, the third conductive layer 13, and the fourth conductive layer 14 are stacked on the substrate 10 in the z direction (third direction). The second conductive layer 12 is parallel to the first conductive layer 11 and is located in the z direction with respect to the first conductive layer 11. The third conductive layer 13 is parallel to the first conductive layer 11 and is located in the z direction with respect to the second conductive layer 12. The fourth conductive layer 14 is parallel to the first conductive layer 11 and is located in the z direction with respect to the third conductive layer 13.

The first conductive layer 11, the second conductive layer 12, the third conductive layer 13, and the fourth conductive layer 14 are made of, for example, metal or a semiconductor including conductive impurities. The metal is, for example, tungsten (W), titanium nitride (TiN), or tungsten nitride (WN). The semiconductor including conductive impurities is, for example, n-type or p-type polysilicon.

The first insulating layers 30 are provided between the substrate 10 and the first conductive layer 11, between the first conductive layer 11 and the second conductive layer 12, between the second conductive layer 12 and the third conductive layer 13, and between the third conductive layer 13 and the fourth conductive layer 14. The first insulating layer 30 is made of, for example, silicon oxide.

The second insulating layer 40 is provided on the first conductive layer 11, the second conductive layer 12, the third conductive layer 13, and the fourth conductive layer 14. The second insulating layer 40 is made of, for example, silicon oxide.

The first contact electrode 21 extends in the z direction in the second insulating layer 40. The first contact electrode 21 is connected to the first conductive layer 11.

The second contact electrode 22 extends in the z direction in the second insulating layer 40. The second contact electrode 22 is connected to the second conductive layer 12.

The third contact electrode 23 extends in the z direction in the second insulating layer 40. The third contact electrode 23 is connected to the third conductive layer 13.

The fourth contact electrode 24 extends in the z direction in the second insulating layer 40. The fourth contact electrode 24 is connected to the fourth conductive layer 14.

The first contact electrode 21, the second contact electrode 22, the third contact electrode 23, and the fourth contact electrode 24 are arranged in the y direction in this order. The second contact electrode 22 is located between the first contact electrode 21 and the third contact electrode 23. The third contact electrode 23 is located between the second contact electrode 22 and the fourth contact electrode 24.

The length of the first contact electrode 21 in the z direction is larger than the length of the second contact electrode 22 in the z direction. The length of the second contact electrode 22 in the z direction is larger than the length of the third contact electrode 23 in the z direction. The length of the third contact electrode 23 in the z direction is larger than the length of the fourth contact electrode 24 in the z direction.

The first contact electrode 21, the second contact electrode 22, the third contact electrode 23, and the fourth contact electrode 24 are made of, for example, metal. The metal is, for example, tungsten (W), titanium nitride (TiN), or tungsten nitride (WN).

The first contact electrode 21, the second contact electrode 22, the third contact electrode 23, and the fourth contact electrode 24 are connected to, for example, metal wires (net illustrated) on the second insulating layer 40. The first contact electrode 21, the second contact electrode 22, the third contact electrode 23, and the fourth contact electrode 24 are electrically separated from each other.

The first conductive layer 11, the second conductive layer 12, the third conductive layer 13, and the fourth conductive layer 14 are formed stepwise in the y direction. The third conductive layer 13 and the fourth conductive layer 14 are not provided between the first contact electrode 21 and the second contact electrode 22. The fourth conductive layer 14 is not provided between the second contact electrode 22 and the third contact electrode 23.

A region (R in FIG. 3B) in which the second conductive layer 12 is absent is provided between the second contact electrode 22 and the third contact electrode 23. In other words, a hole is formed in the second conductive layer 12 below a region between the second contact electrode 22 and the third contact electrode 23.

A plurality of word lines KL are connected to one of the first conductive layer 11, the second conductive layer 12, the third conductive layer 13, and the fourth conductive layer 14. The plurality of word lines WL extend in the x direction. In FIG. 3A, an end portion of the fourth conductive layer 14 below the second insulating layer 40 and end portions of the plurality of word lines WL are represented by dashed lines. Among the word lines WL in the same xy plane in the memory cell array, odd-numbered or even-numbered word lines WL are connected to the first conductive layer 11, the second conductive layer 12, the third conductive layer 13, and the fourth conductive layer 14.

Next, a method for manufacturing the memory device according to the embodiment will be described. FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, and FIG. 14B are diagrams schematically illustrating the memory device according to the embodiment that is being manufactured. FIG. 4A, FIG. 5A, FIG. 6A, FIG. 7A, FIG. 8A, FIG. 9A, FIG. 10A, FIG. 11A, FIG. 12A, FIG. 13A, and FIG. 14A are top views. FIG. 4B, FIG. 5B, FIG. 6B, FIG. 7B, FIG. 8B, FIG. 9B, FIG. 10B, FIG. 11B, FIG. 12B, FIG. 13B, and FIG. 14B are cross-sectional views taken along the lines AA' of FIG. 4A, FIG. 5A, FIG. 6A, FIG. 7A, FIG. 8A, FIG. 9A, FIG. 10A, FIG. 11A, FIG. 12A, FIG. 13A, and FIG. 14A, respectively.

The method for manufacturing the memory device according to the embodiment includes: stacking a first conductive layer, a second conductive layer, a third conductive layer, and a fourth conductive layer with first insulating layer interposed therebetween; forming a first mask member having an opening portion on the fourth conductive layer; forming a second mask member covering a first region in the opening portion, a second region and a third region on both sides of the first region being exposed through the second mask member; removing the fourth conductive layer using the second mask member as a mask; removing the second mask member; forming a third mask member covering a portion of the third conductive layer in the third region, the third conductive layer in the second region and the fourth conductive layer in the first region being exposed through the third mask member; removing the fourth conductive layer and the third conductive layer, or the third conductive layer and the second conductive layer using the third mask member as a mask; removing the third mask member; removing the first mask member; forming a second insulating layer on the first conductive layer, the second conductive layer, the third conductive layer, and the fourth conductive layer; forming a first contact hole reaching the first conductive layer, a second contact hole reaching the second conductive layer, a third contact hole reaching the third conductive layer, and a fourth contact hole reaching the fourth conductive layer in the second insulating layer; filling the first contact hole, the second contact hole, the third contact hole, and the fourth contact hole to form a first electrode, a second electrode, a third electrode, and a fourth electrode.

Figure 4A:
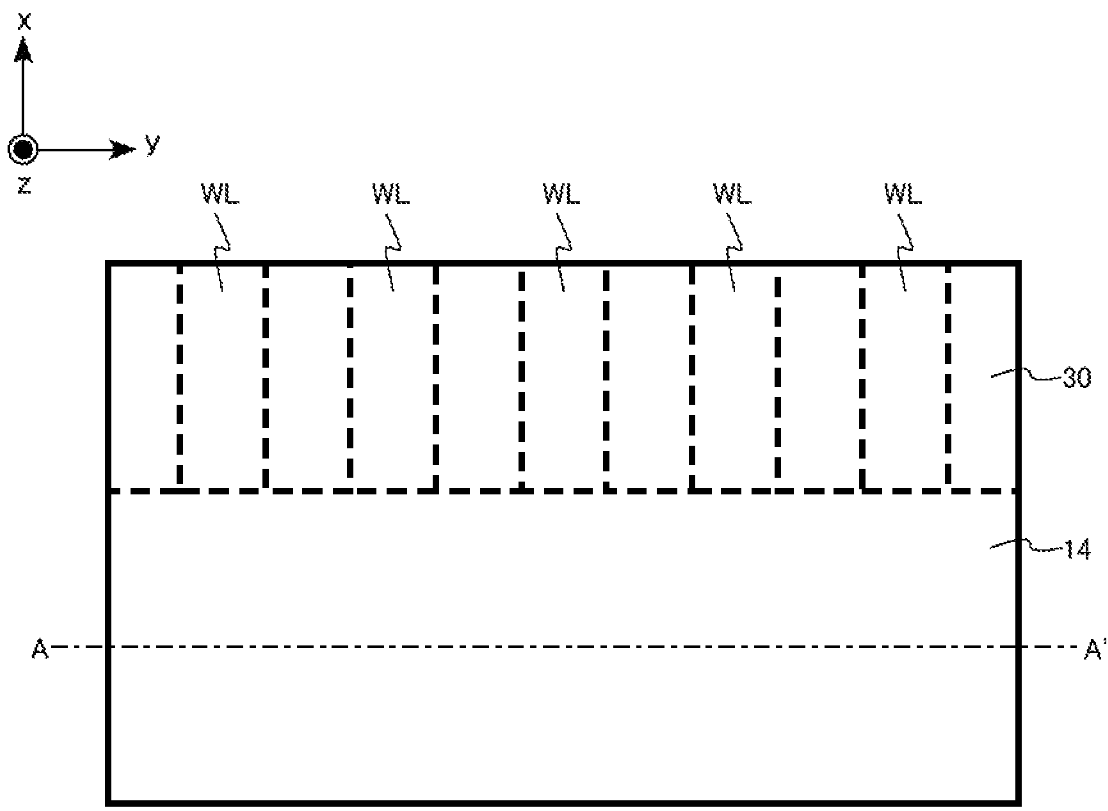
FIGS. 4A and 4B are diagrams schematically illustrating the memory device according to the embodiment that is being manufactured.
Figure 4B:
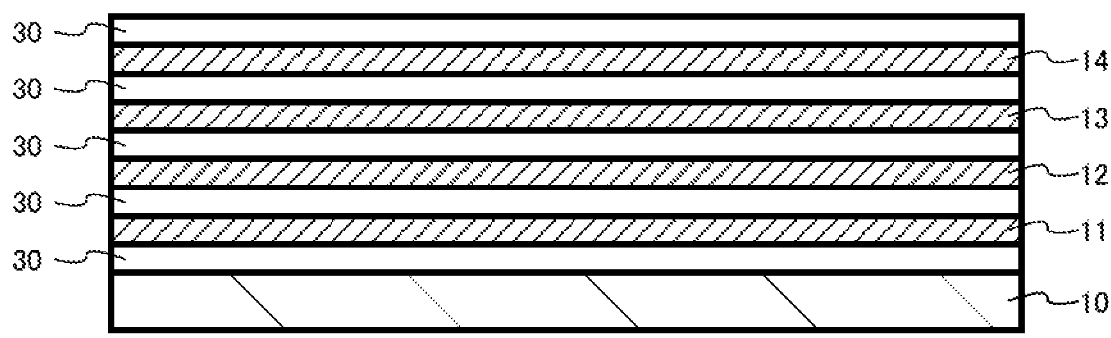

First, the first conductive layer 11, the second conductive layer 12, the third conductive layer 13, and the fourth conductive layer 14 are stacked on the substrate 10 with the first insulating layers 30 interposed therebetween (FIGS. 4A and 4B). The first conductive layer 11, the second conductive layer 12, the third conductive layer 13, and the fourth conductive layer 14 are patterned so as to be connected to a plurality of word lines WL. In FIG. 4A, the end portion of the fourth conductive layer 14 below the first insulating layer 30 and the end portions of the plurality of word lines WL are represented by dashed lines.

Figure 5A:
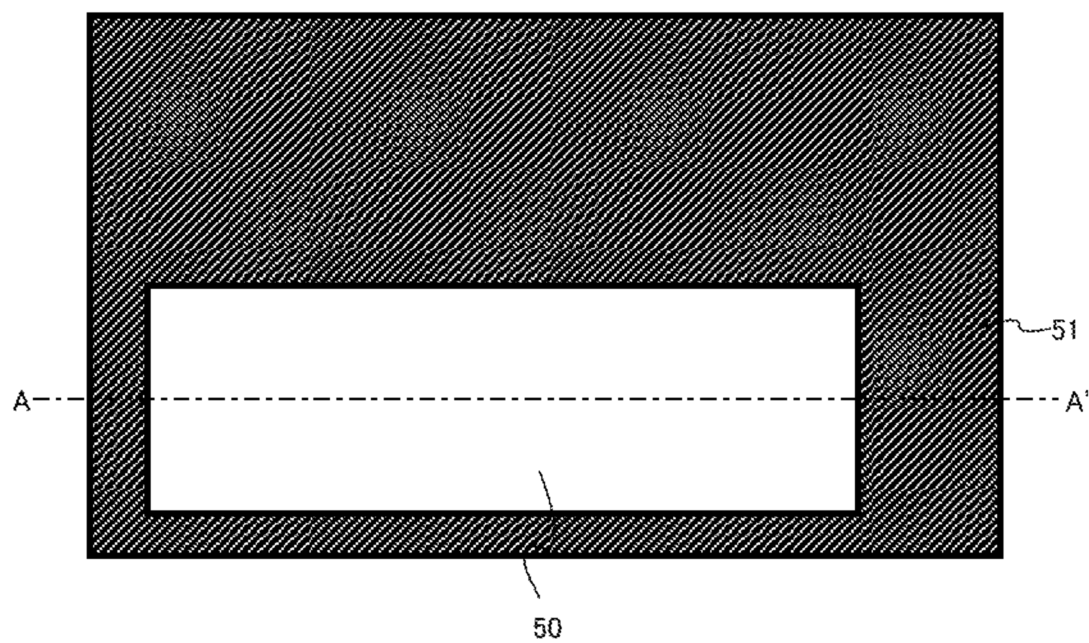
FIGS. 5A and 5B are diagrams schematically illustrating the memory device according to the embodiment that is being manufactured.
Figure 5B:
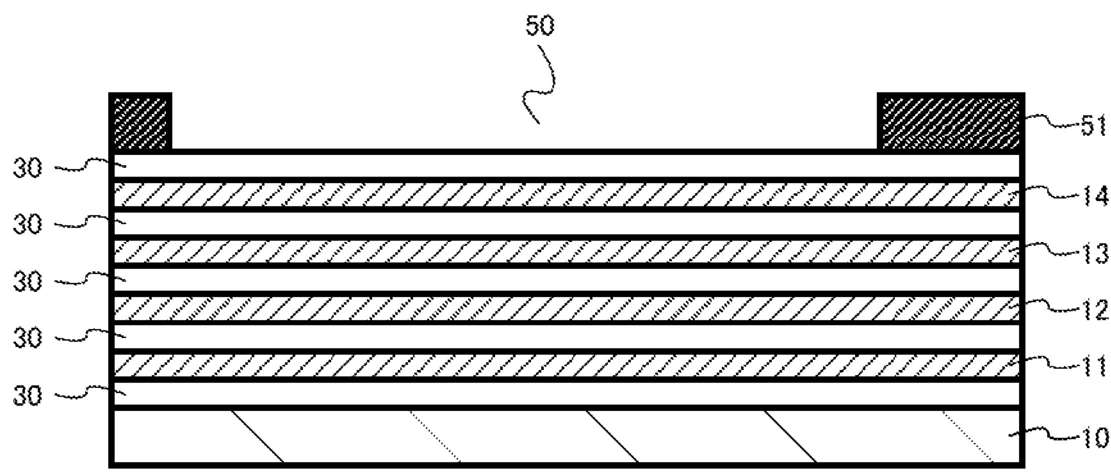

Then, a first mask member 51 is formed on the surface of the first insulating layer 30 on the fourth conductive layer 14 (FIGS. 5A and 5B). The first mask member 51 has an opening portion 50. The first mask member 51 is formed by, for example, the deposition of an insulating layer by a chemical vapor deposition method (CVD method), a lithography method, and etching by a reactive ion etching method (RIE method).

The first mask member 51 is made of, for example, an inorganic material. The first mask member 51 is made of, for example, silicon nitride or amorphous silicon. The first mask member 51 is a so-called hard mask.

Figure 6A:
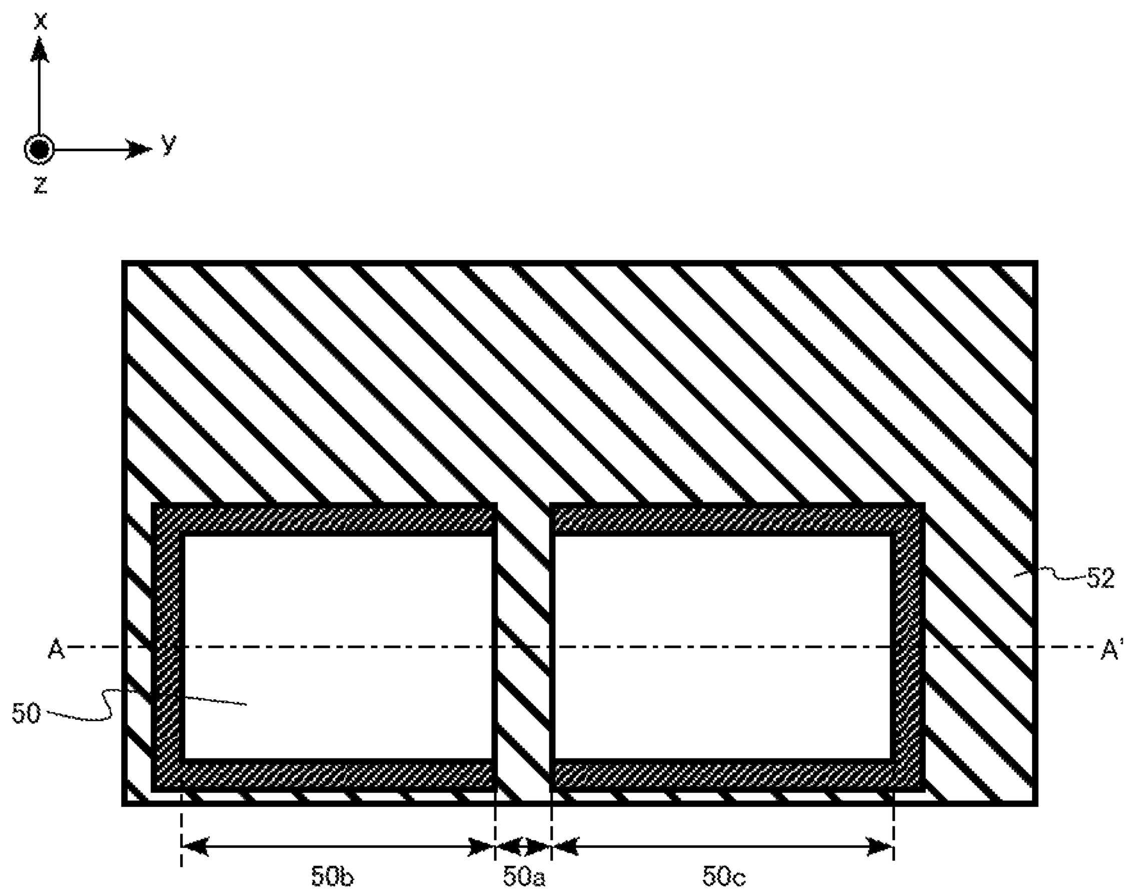
FIGS. 6A and 6B are diagrams schematically illustrating the memory device according to the embodiment that is being manufactured.
Figure 6B:
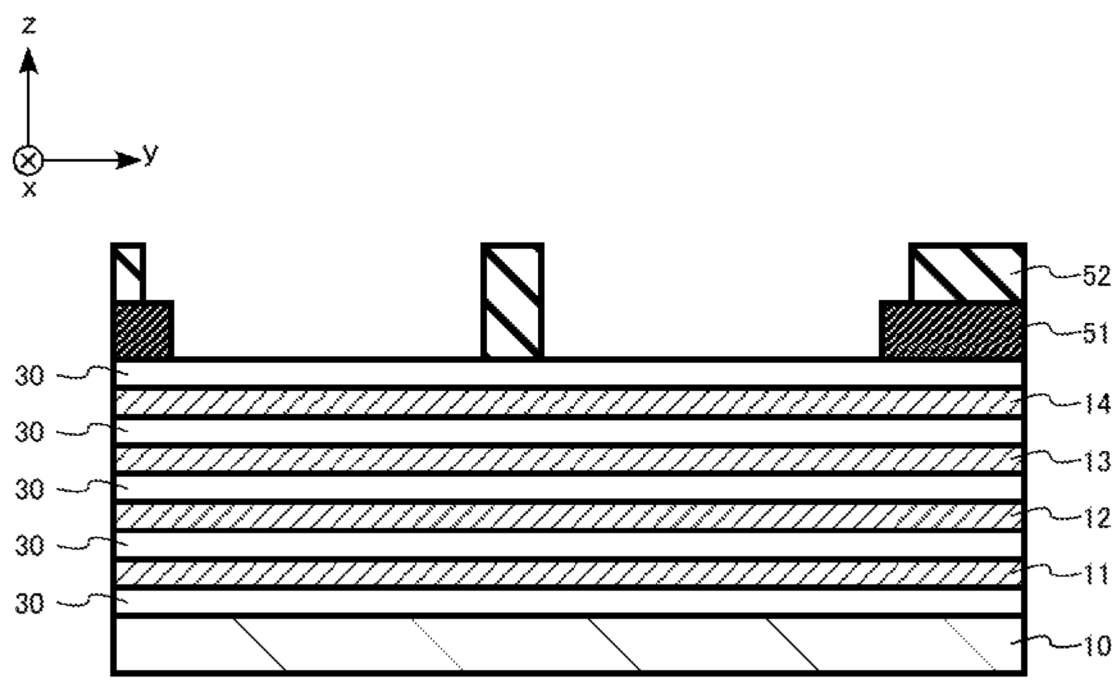

Then, a second mask member 52 is formed (FIGS. 6A and 6B). The second mask member 52 is formed on the surface of the first mask member 51 and the surface of the first insulating layer 30.

The second mask member 52 covers a first region 50*a* in the opening portion 50 and a second region 50*b* and a third region 50*c* provided on both sides of the first region 50*a* are exposed through the second mask member 52.

The second mask member 52 is, for example, a photoresist. The second mask member 52 is formed by, for example, a lithography method.

Figure 7A:
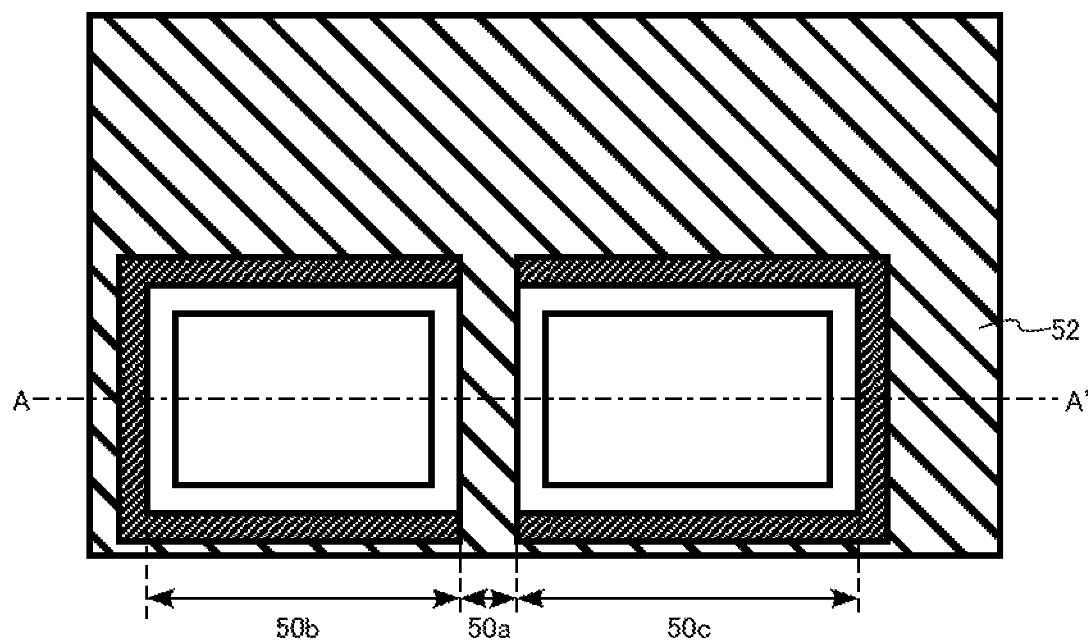
FIGS. 7A and 7B are diagrams schematically illustrating the memory device according to the embodiment that is being manufactured.
Figure 7B:
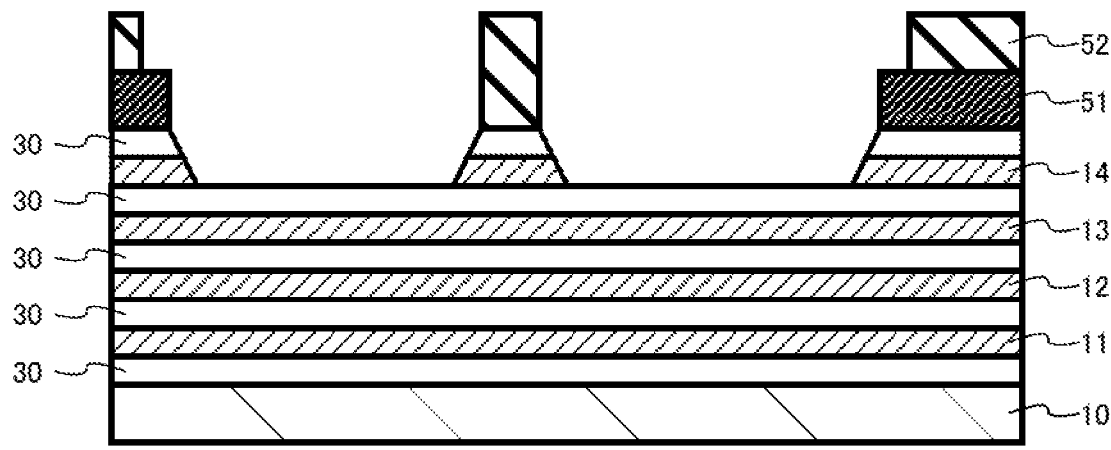

Then, the first insulating layer 30 and the fourth conductive layer 14 are removed using the second mask member 52 and the first mask member 51 as a mask (FIGS. 7A and 7B). The first insulating layer 30 and the fourth conductive layer 14 are removed by, for example, an RIE method.

Figure 8A:
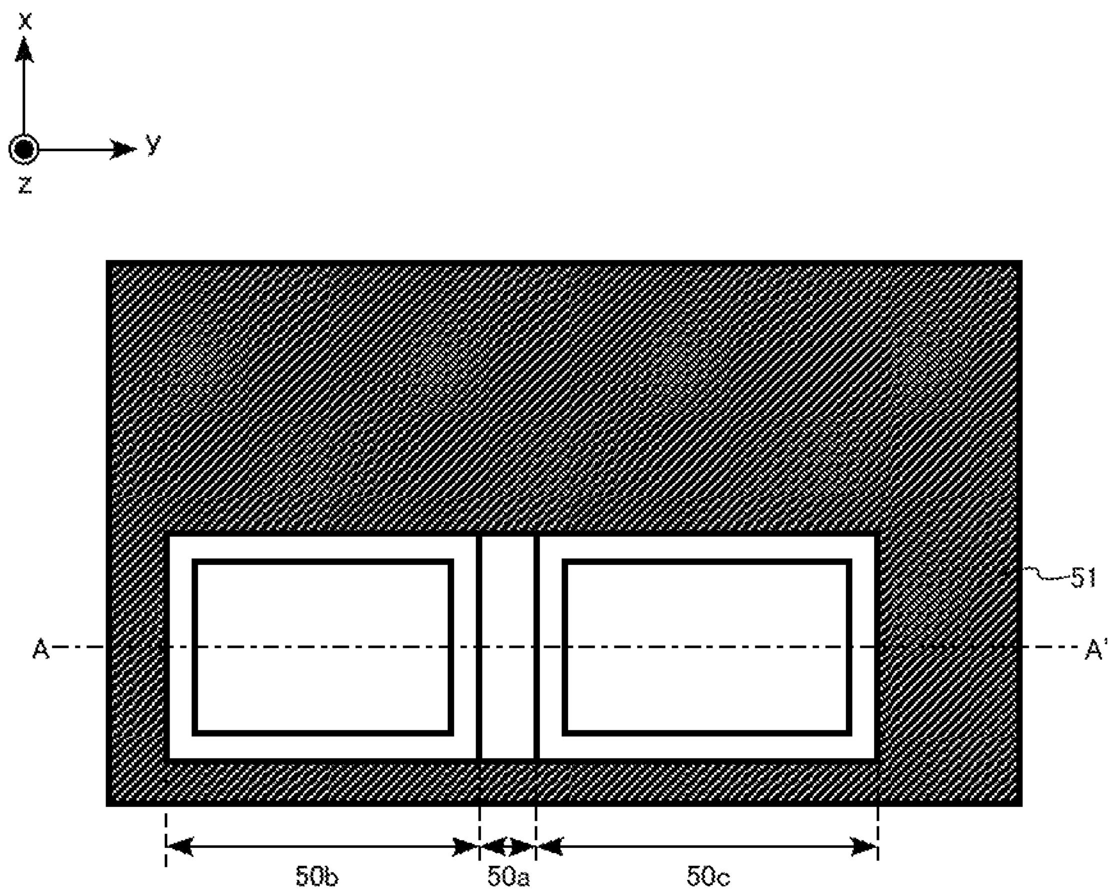
FIGS. 8A and 8B are diagrams schematically illustrating the memory device according to the embodiment that is being manufactured.
Figure 8B:
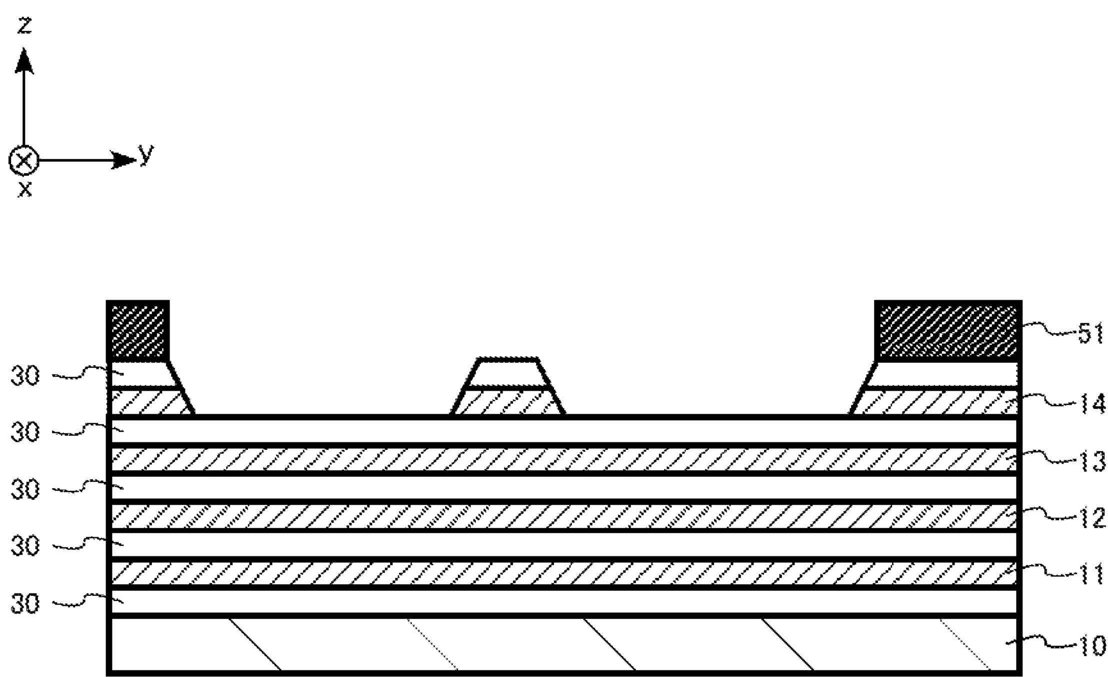

Then, the second mask member 52 is removed (FIGS. 8A and 8E). The second mask member 52 is removed by, for example, ashing.

Figure 9A:
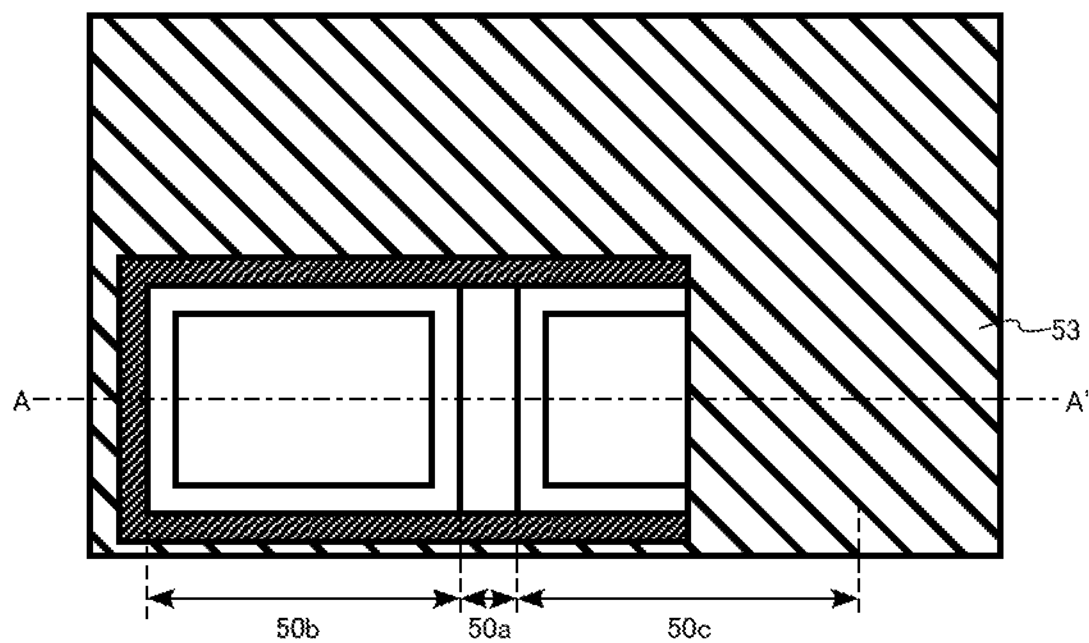
FIGS. 9A and 9B are diagrams schematically illustrating the memory device according to the embodiment that is being manufactured.
Figure 9B:
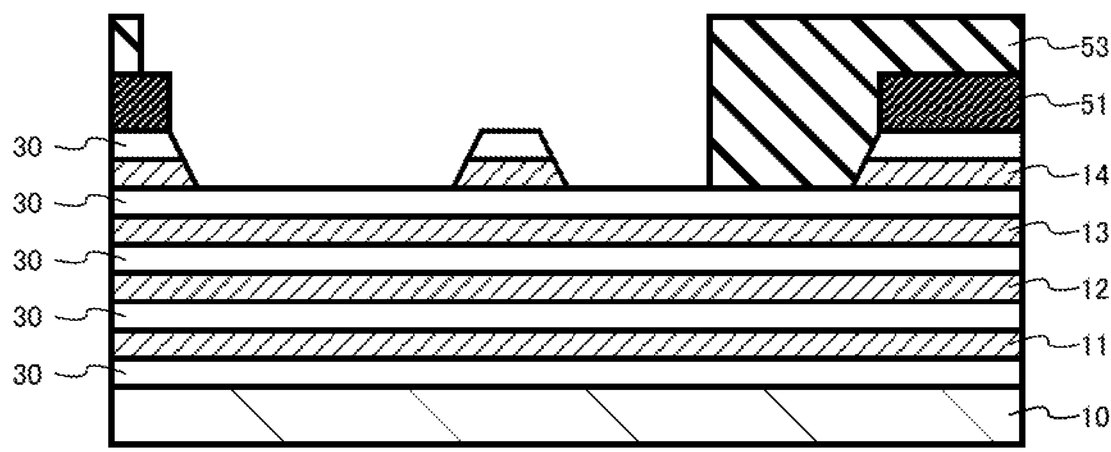

Then, a third mask member 53 is formed (FIGS. 9A and 9B). The third mask member 53 is formed on the surface of the first mask member 51 and the surface of the first insulating layer 30.

The third mask member 53 covers a portion of the third conductive layer 13 under the third region 50*c*. An end portion of the third mask member 53 is located on the surface of the first insulating layer 30 on the third conductive layer 13.

The entire surface of the first insulating layer 30 on the third conductive layer 13 in the second region 50*b* is exposed through the third mask member 53. The entire surface of the first insulating layer 30 on the fourth conductive layer 14 in the first region 50*a* is exposed through the third mask member 53.

The third mask member 53 is, for example, a photoresist. The third mask member 53 is formed by, for example, a lithography method.

Figure 10A:
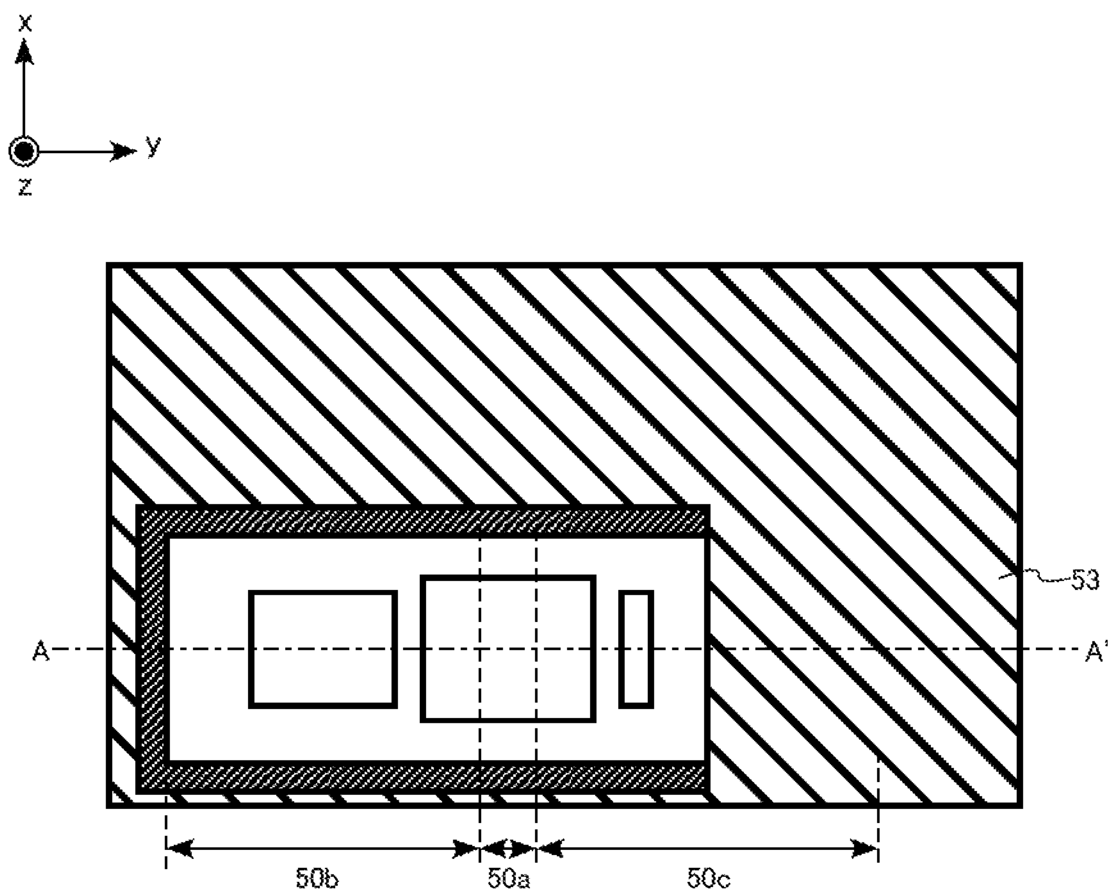
FIGS. 10A and 10B are diagrams schematically illustrating the memory device according to the embodiment that is being manufactured.
Figure 10B:
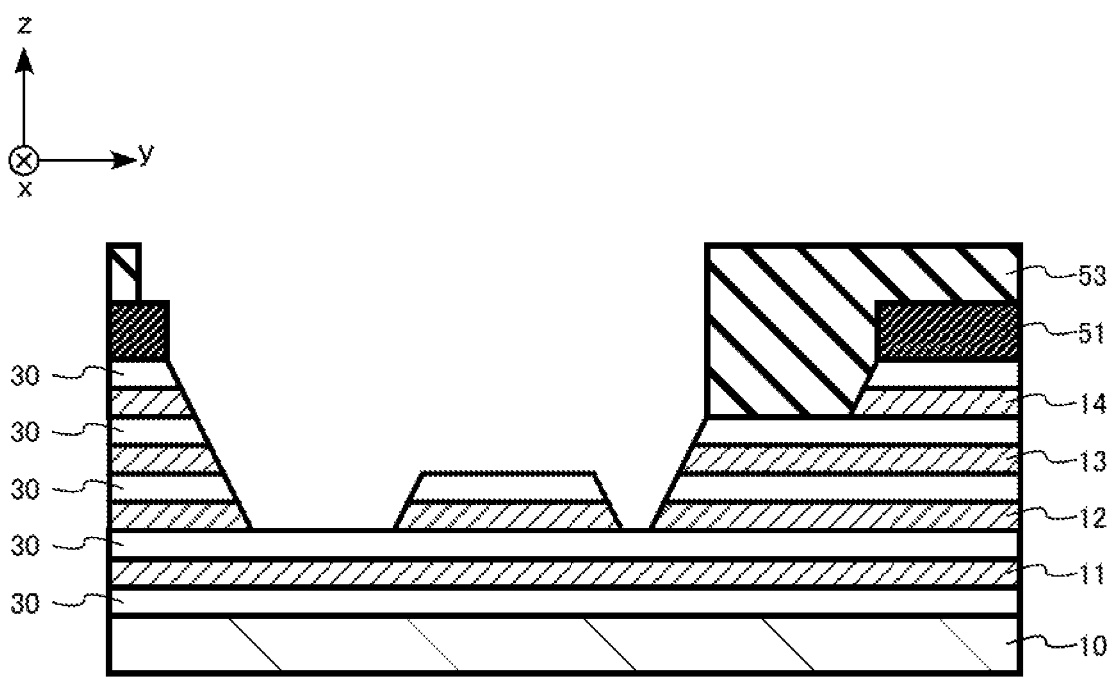

Then, the fourth conductive layer 14 and the third conductive layer 13 in the first region 50*a* are removed using the third mask member 53 as a mask. In addition, the third conductive layer 13 and the second conductive layer 12 in the second region 50*b* are removed using the third mask member 53 as a mask. Furthermore, the third conductive layer 13 and the second conductive layer 12 in the third region 50*c* are removed using the third mask member 53 as a mask (FIGS. 10A and 10B).

Figure 11A:
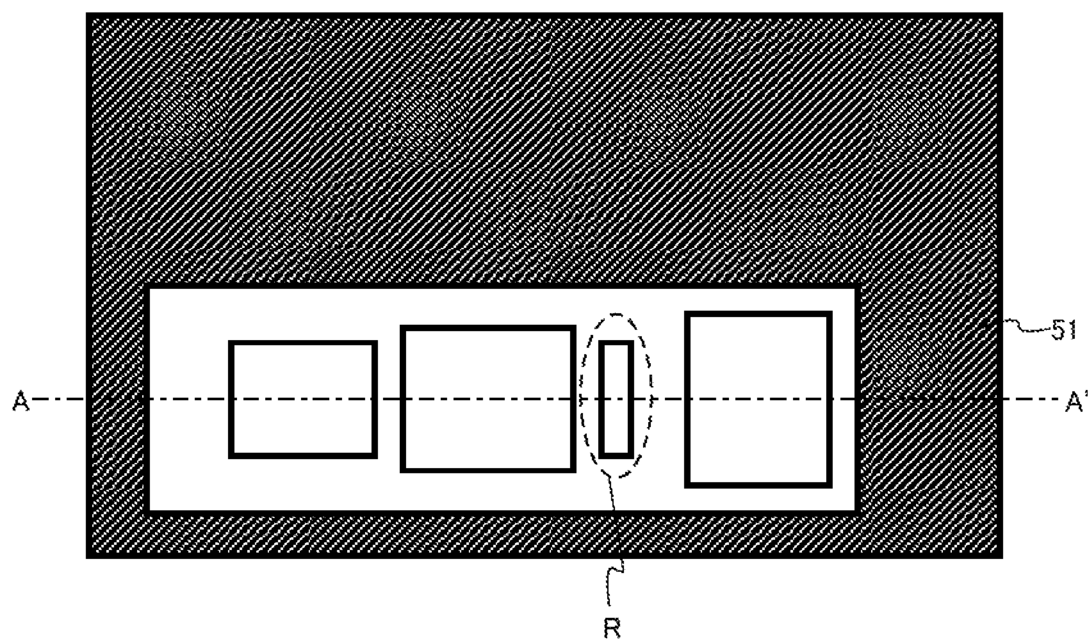
FIGS. 11A and 11B are diagrams schematically illustrating the memory device according to the embodiment that is being manufactured.
Figure 11B:
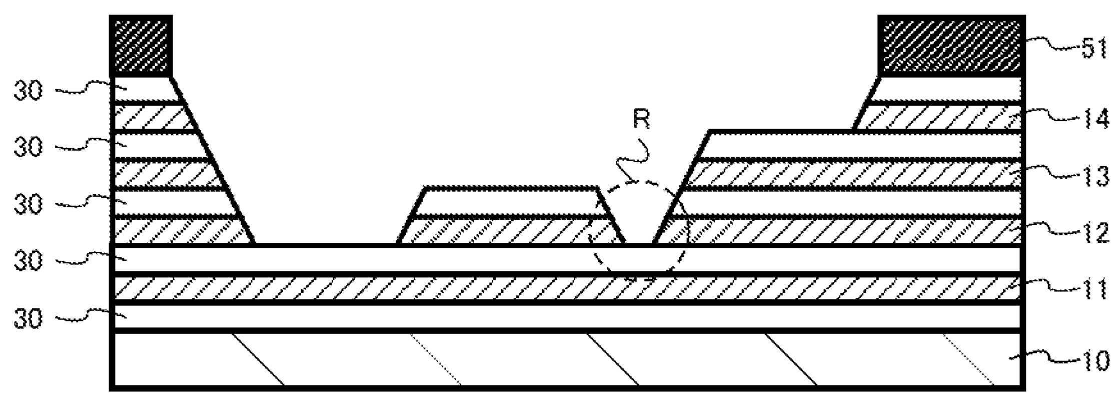

Then, the third mask member 53 is removed (FIGS. 11A and 11B). The third mask member 53 is removed by, for example, ashing. At this time, the region R in which the second conductive layer 12 is absent is formed.

Figure 12A:
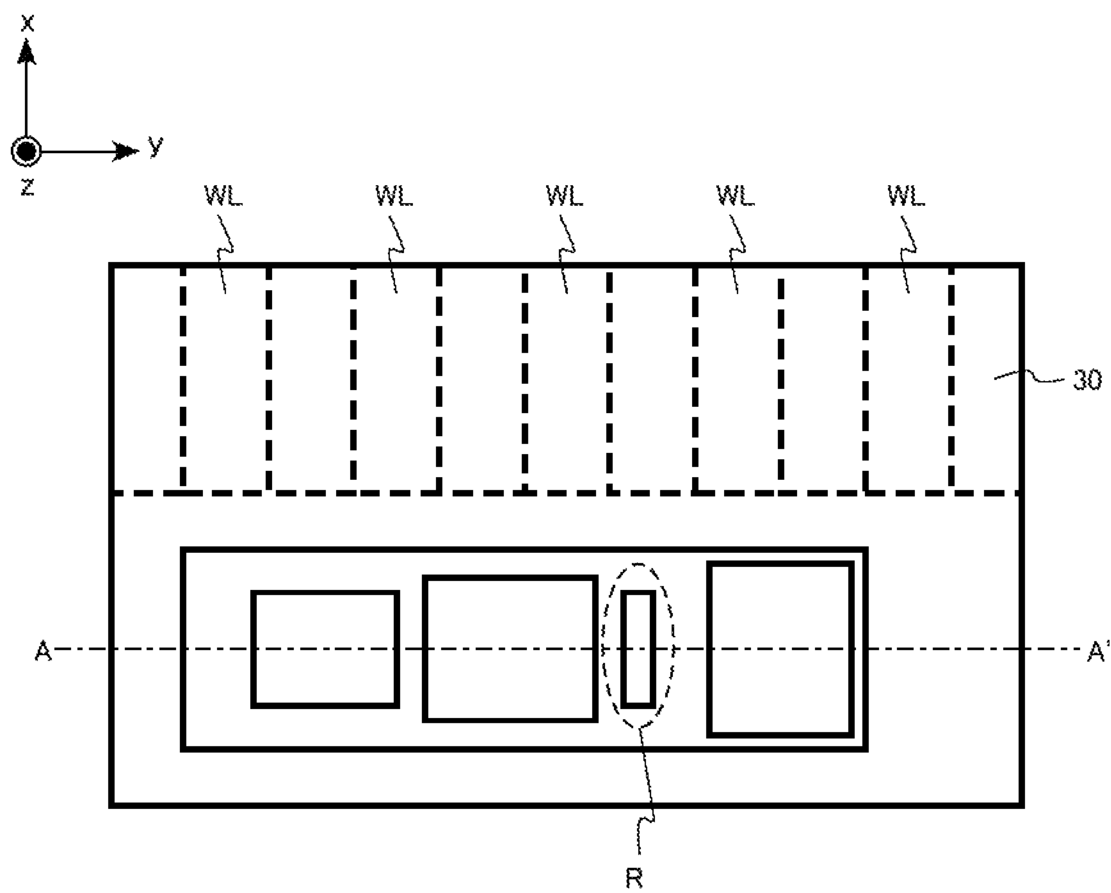
FIGS. 12A and 12B are diagrams schematically illustrating the memory device according to the embodiment that is being manufactured.
Figure 12B:
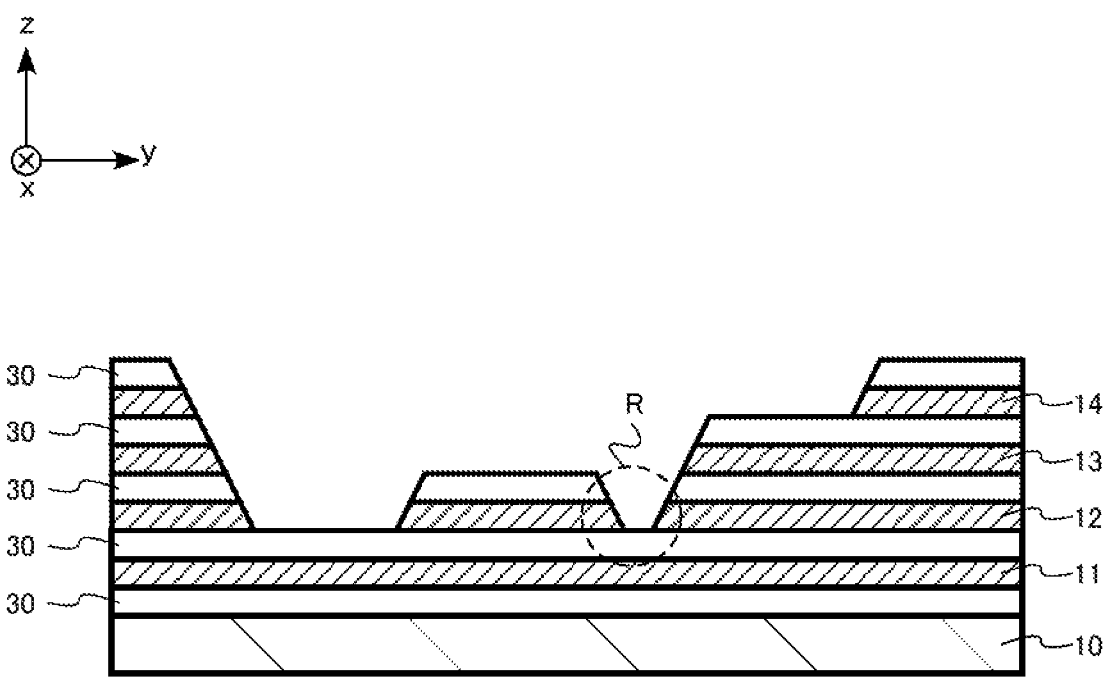

Then, the first mask member 51 is removed (FIGS. 12A and 12B). The first mask member 51 is removed by, for example, wet etching.

Figure 13A:
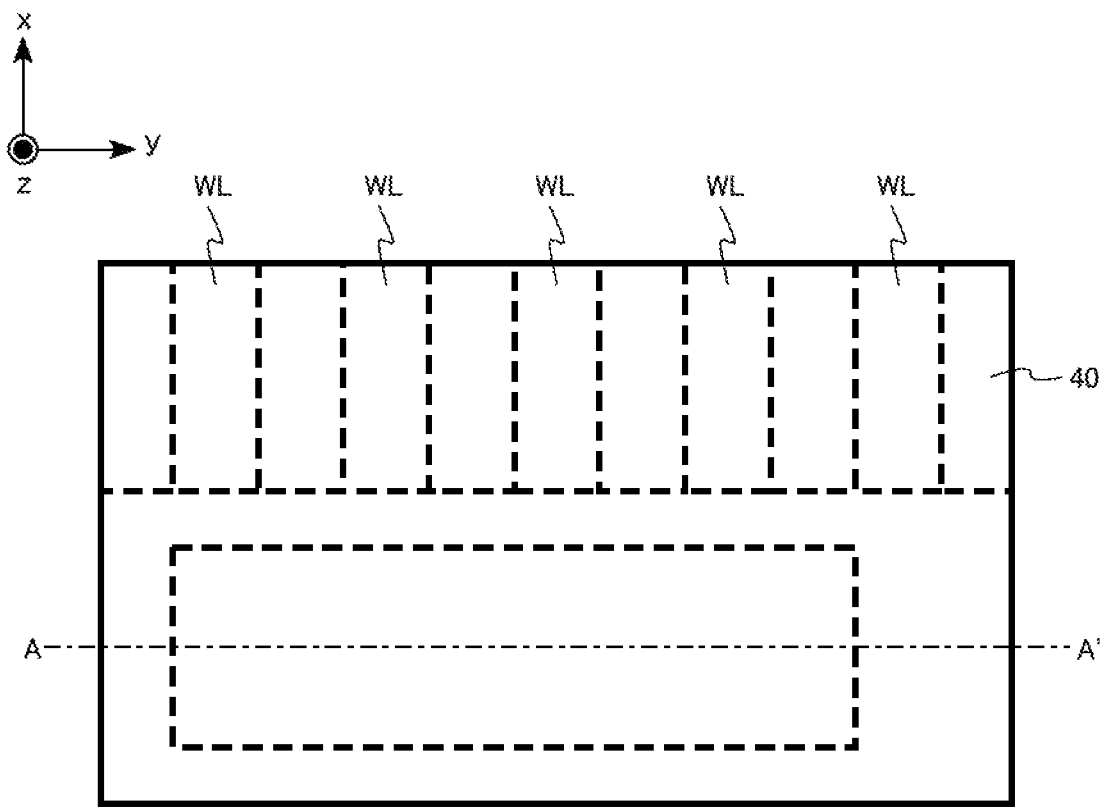
FIGS. 13A and 13B are diagrams schematically illustrating the memory device according to the embodiment that is being manufactured.
Figure 13B:
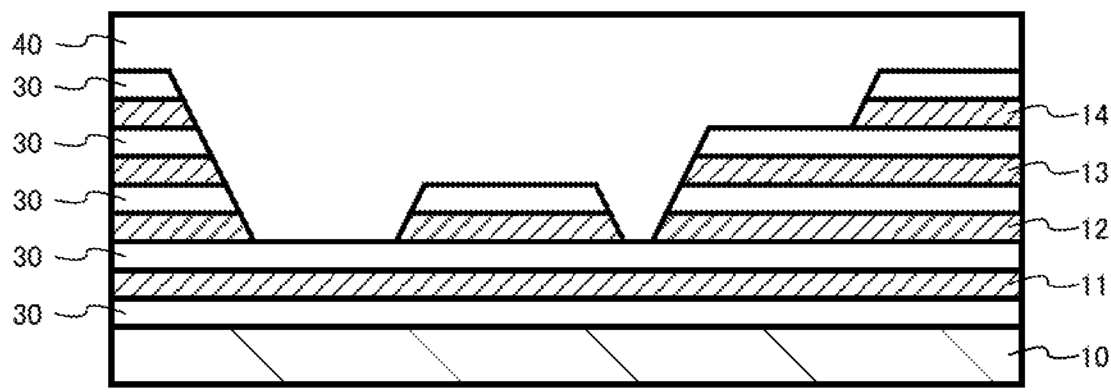

Then, the second insulating layer 40 is formed (FIGS. 13A and 13B). The second insulating layer 40 is formed on the first conductive layer 11, the second conductive layer 12, the third conductive layer 13, and the fourth conductive layer 14. The second insulating layer 40 is formed by, for example, the deposition of a film by a CVD method and the planarization of the surface of the film by a chemical mechanical polishing method (CMP method).

Figure 14A:
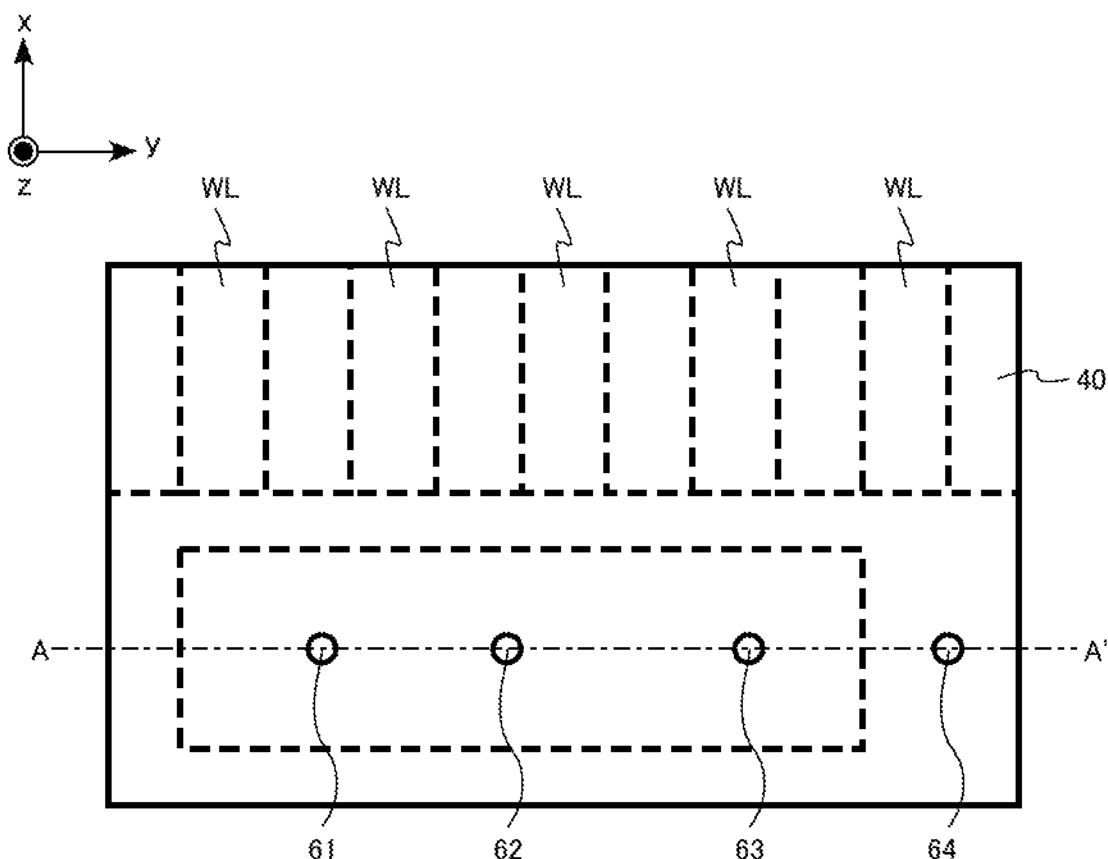
FIGS. 14A and 14B are diagrams schematically illustrating the memory device according to the embodiment that is being manufactured.
Figure 14B:
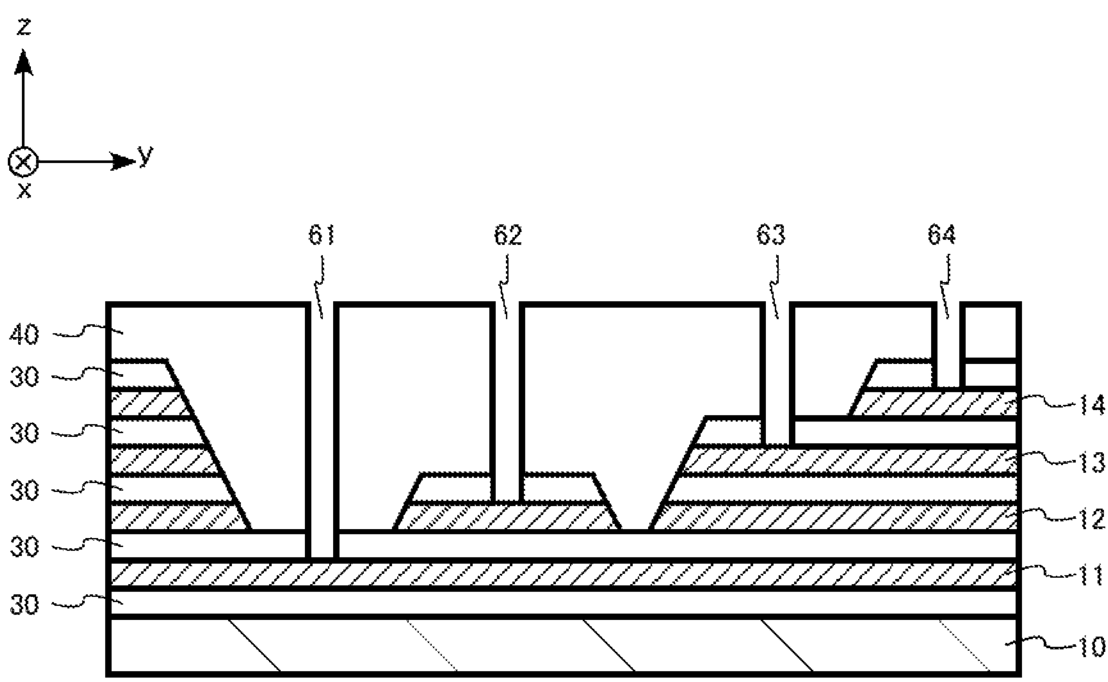

Then, a first contact hole 61, a second contact hole 62, a third contact hole 63, and a fourth contact hole 64 are formed in the second insulating layer 40 (FIGS. 14A and 14B). The first contact hole 61 reaches the first conductive layer 11. The second contact hole 62 reaches the second conductive layer 12. The third contact hole 63 reaches the third conductive layer 13. The fourth contact hole 64 reaches the fourth conductive layer 14.

The first contact hole 61, the second contact hole 62, the third contact hole 63, and the fourth contact hole 64 are formed by, for example, an RIE method.

Then, the first contact hole 61, the second contact hole 62, the third contact hole 63, and the fourth contact hole 64 are filled with, for example, metal or a semiconductor to form the first contact electrode 21, the second contact electrode 22, the third contact electrode 23, and the fourth contact electrode 24, respectively.

The contact region 211 according to the embodiment is formed by the above-mentioned manufacturing method.

Next, the function and effect of the memory device according to the embodiment will be described.

In the three-dimensional memory according to the embodiment, it is necessary to form the contact electrodes for applying a voltage or a current to the stacked wiring layers. The contact electrodes are connected to the wiring layers drawn from the memory cell array in the contact region provided in the periphery of the memory cell array. In a case in which the area of the contact region increases, the area of the chip increases, which is not preferable. In particular, in a case in which the number of stacked wiring layers increases with an increase in the degree of integration, the number of contact electrodes also increases. Therefore, it is preferable to reduce the area of the contact region.

Figure 15A:
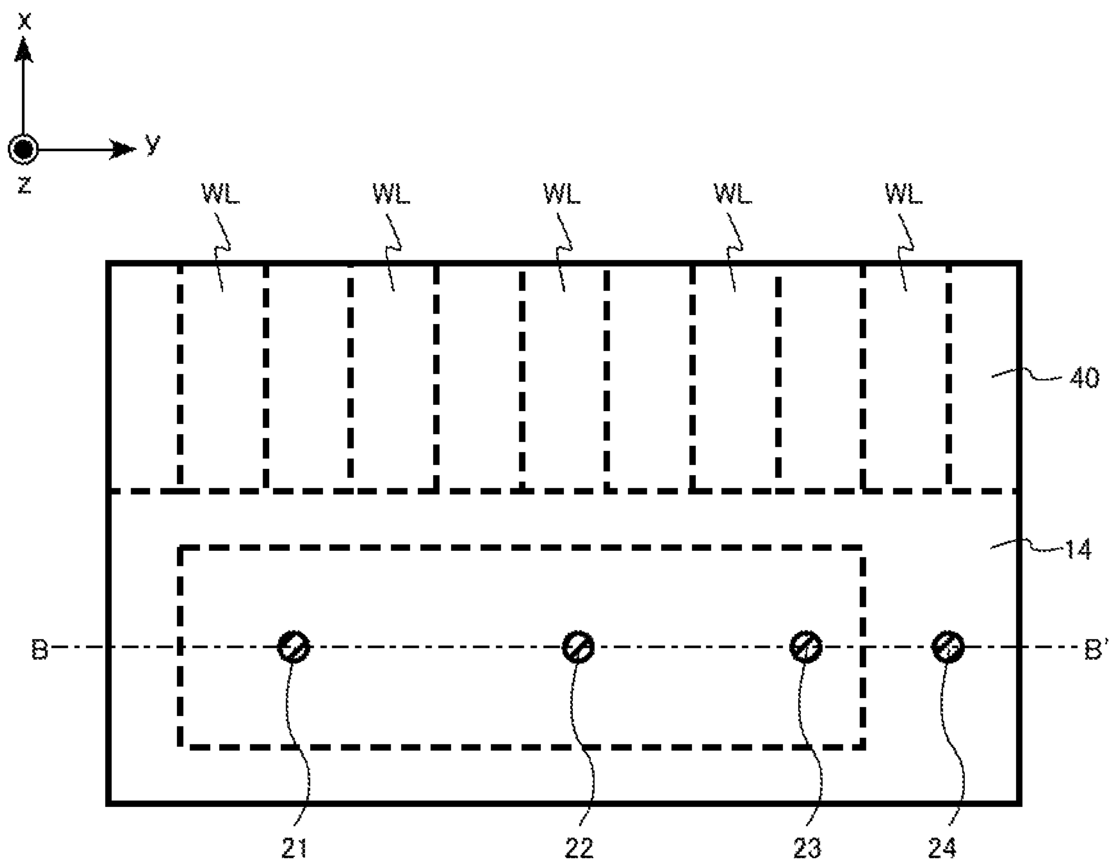
FIGS. 15A and 15B are diagrams schematically illustrating a contact region according to a comparative example.
Figure 15B:
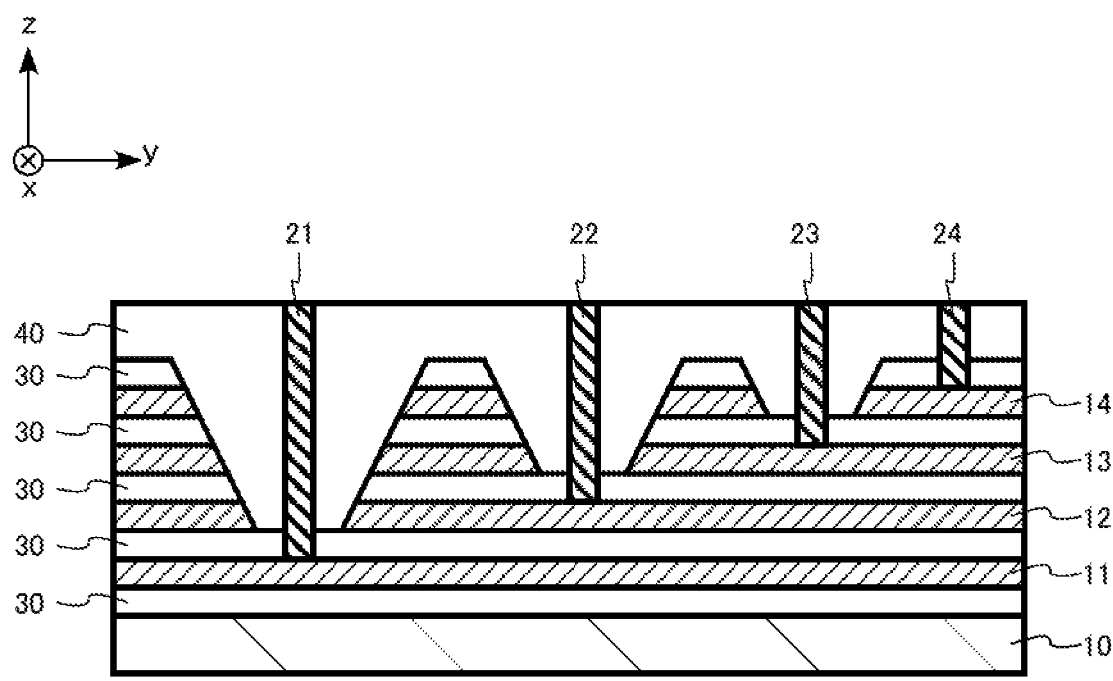

FIGS. 15A and 15B are diagrams schematically illustrating a contact region according to a comparative example. FIG. 15A is a top view and FIG. 15B is a cross-sectional view. FIG. 15B is a cross-sectional view taken along the line BB' of FIG. 15A.

Similarly to the contact region 211 according to the embodiment, the contact region according to the comparative example includes a substrate 10, a first conductive layer 11, a second conductive layer 12, a third conductive layer 13, a fourth conductive layer 14, a first contact electrode 21, a second contact electrode 22, a third contact electrode 23, a fourth contact electrode 24, a first insulating layer 30, a second insulating layer 40, and a plurality of word lines WL.

Unlike the contact region 211 according to the embodiment, the third conductive layer 13 and the fourth conductive layer 14 are provided between the first contact electrode 21 and the second contact electrode 22. In addition, the fourth conductive layer 14 is provided between the second contact electrode 22 and the third contact electrode 23.

Next, a method for manufacturing the memory device according to the comparative example will be described. FIG. 16A, FIG. 16B, FIG. 17A, FIG. 17B, FIG. 18A, FIG. 18B, FIG. 19A, FIG. 19B, FIG. 20A, FIG. 20B, FIG. 21A, and FIG. 21B are diagrams schematically illustrating the memory device according to the comparative example that is being manufactured. FIG. 16A, FIG. 17A, FIG. 18A, FIG. 19A, FIG. 20A, and FIG. 21A are top views. FIG. 16B, FIG. 17B, FIG. 18B, FIG. 19B, FIG. 20B, and FIG. 21B are cross-sectional views taken along the lines BB' of FIG. 16A, FIG. 17A, FIG. 18A, FIG. 19A, FIG. 20A, and FIG. 21A, respectively.

Hereinafter, the description of a portion of the same content as that in the method for manufacturing the memory device according to the embodiment will be omitted.

First, the first conductive layer 11, the second conductive layer 12, the third conductive layer 13, and the fourth conductive layer 14 are stacked on the substrate 10 with the first insulating layers 30 interposed therebetween.

Figure 16A:
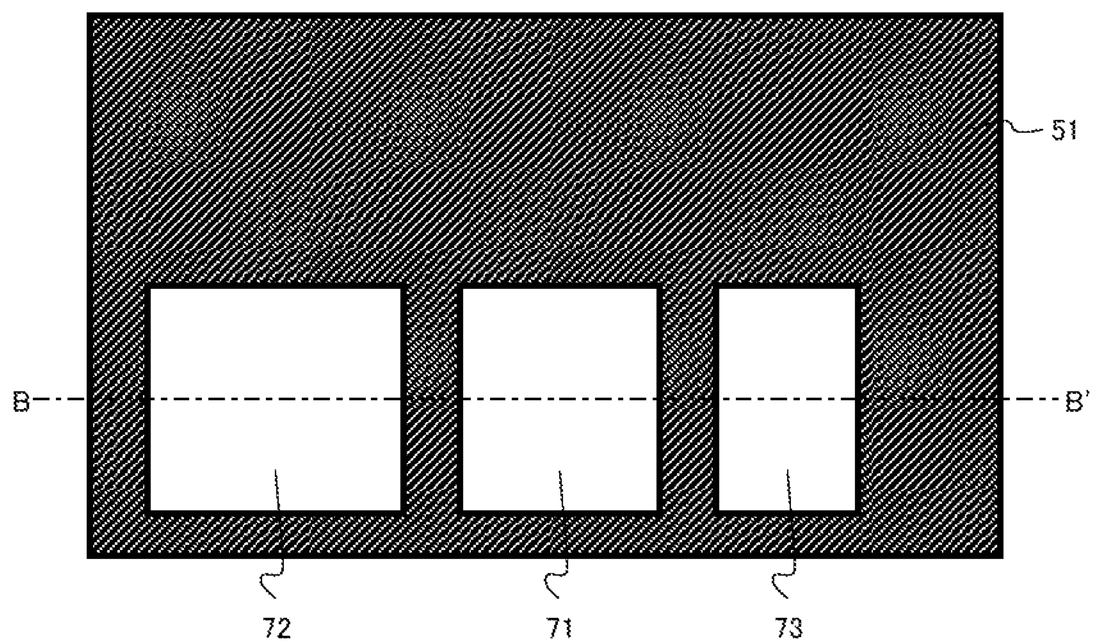
FIGS. 16A and 16B are diagrams schematically illustrating a memory device according to the comparative example that is being manufactured.
Figure 16B:
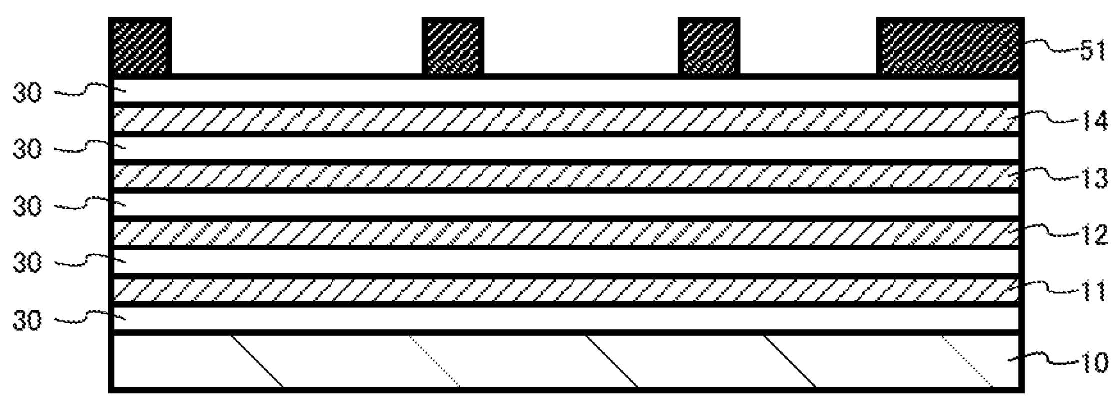

Then, a first mask member 51 is formed on the surface of the first insulating layer 30 on the fourth conductive layer 14 (FIGS. 16A and 16B). The first mask member 51 has three opening portions, that is, a first opening portion 71, a second opening portion 12, and a third opening portion 73 unlike the embodiment. The first opening portion 71 is provided between the second opening portion 72 and the third opening portion 73.

Figure 17A:
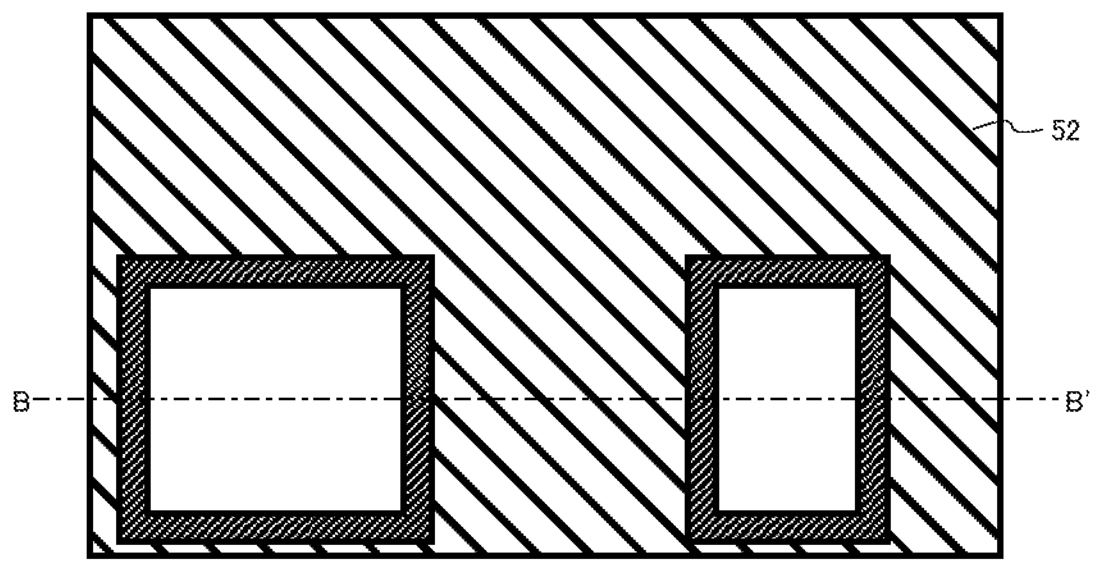
FIGS. 17A and 17B are diagrams schematically illustrating the memory device according to the comparative example that is being manufactured.
Figure 17B:
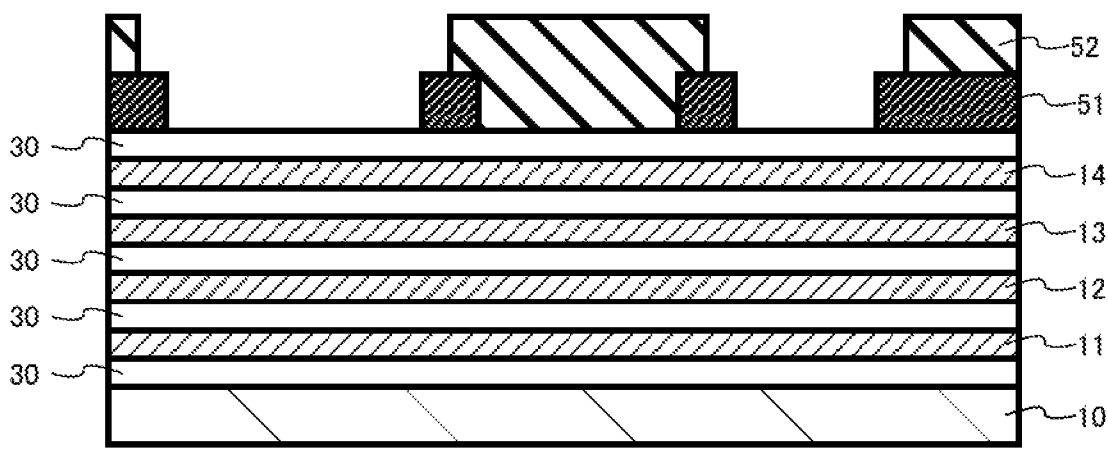

Then, a second mask member 52 is formed (FIGS. 17A and 17B). The second mask member 52 is formed on the surface of the first mask member 51 and the surface of the first insulating layer 30.

The second mask member 52 covers the first opening portion 71 and the second opening portion 72 and the third opening portion 73 are exposed through the second mask member 52.

Figure 18A:
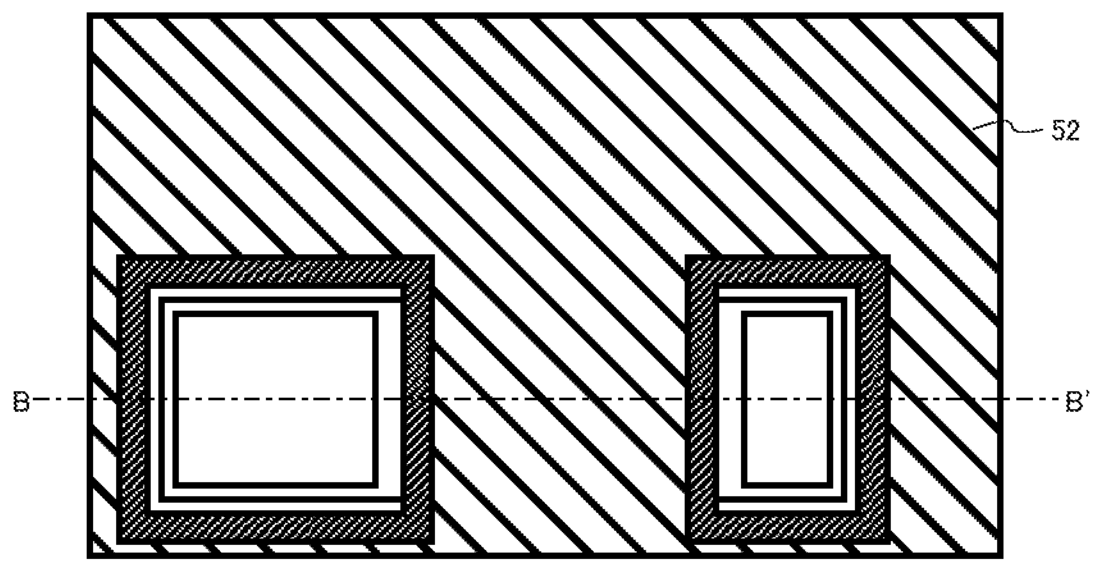
FIGS. 18A and 18B are diagrams schematically illustrating the memory device according to the comparative example that is being manufactured.
Figure 18B:
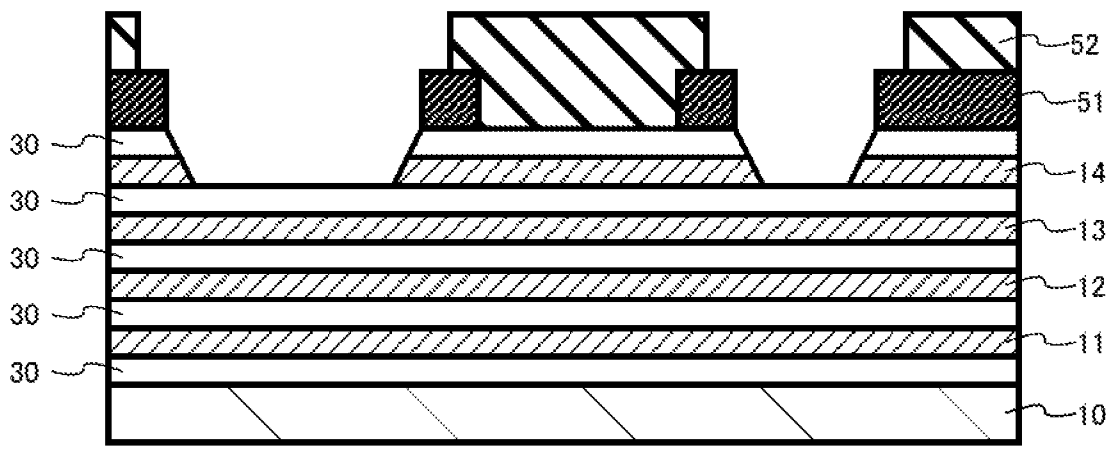

Then, the first insulating layer 30 and the fourth conductive layer 14 are removed using the second mask member 52 and the first mask member 51 as a mask (FIGS. 18A and 18B).

Then, the second mask member 52 is removed.

Figure 19A:
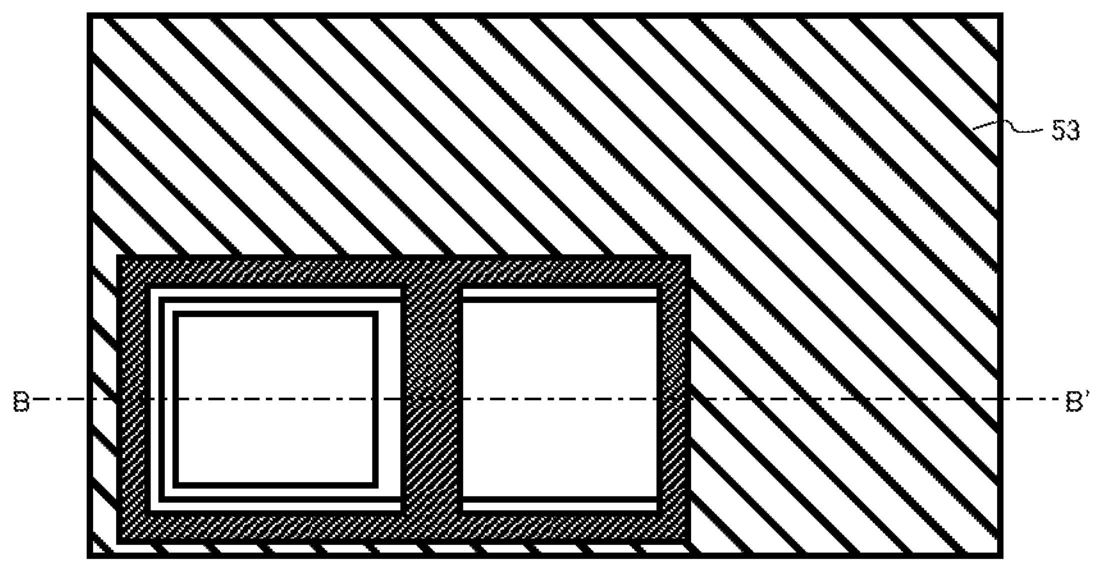
FIGS. 19A and 19B are diagrams schematically illustrating the memory device according to the comparative example that is being manufactured.
Figure 19B:
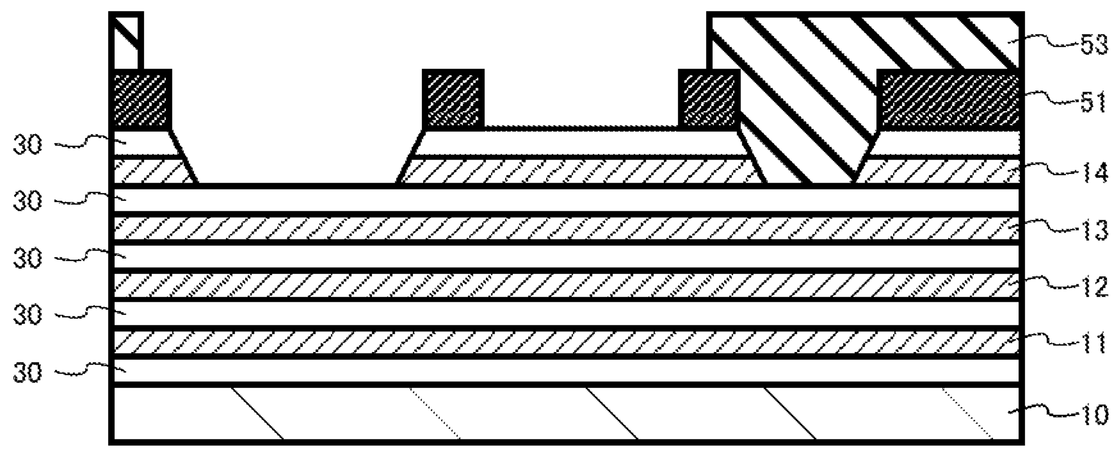

Then, a third mask member 53 is formed (FIGS. 19A and 19B). The third mask member 53 is formed on the surface of the first mask member 51 and the surface of the first insulating layer 30. The third mask member 53 covers the third opening portion 73.

Figure 20A:
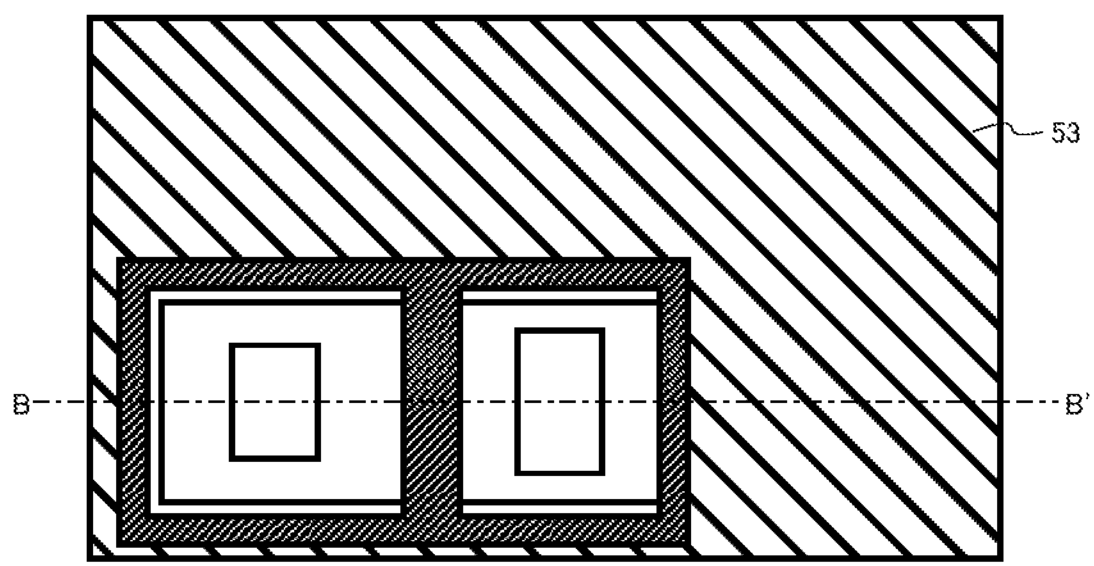
FIGS. 20A and 20B are diagrams schematically illustrating the memory device according to the comparative example that is being manufactured.
Figure 20B:
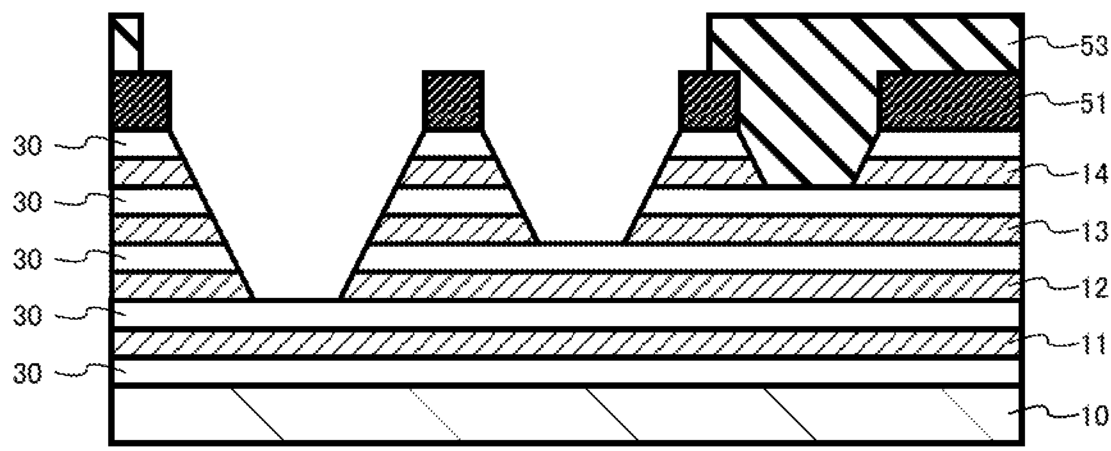

Then, the fourth conductive layer 14 and the third conductive layer 13 in the first opening portion 71 are removed using the third mask member 53 as a mask. In addition, the third conductive layer 13 and the second conductive layer 12 in the second opening portion 72 are removed using the third mask member 53 as a mask (FIGS. 20A and 20B).

Figure 21A:
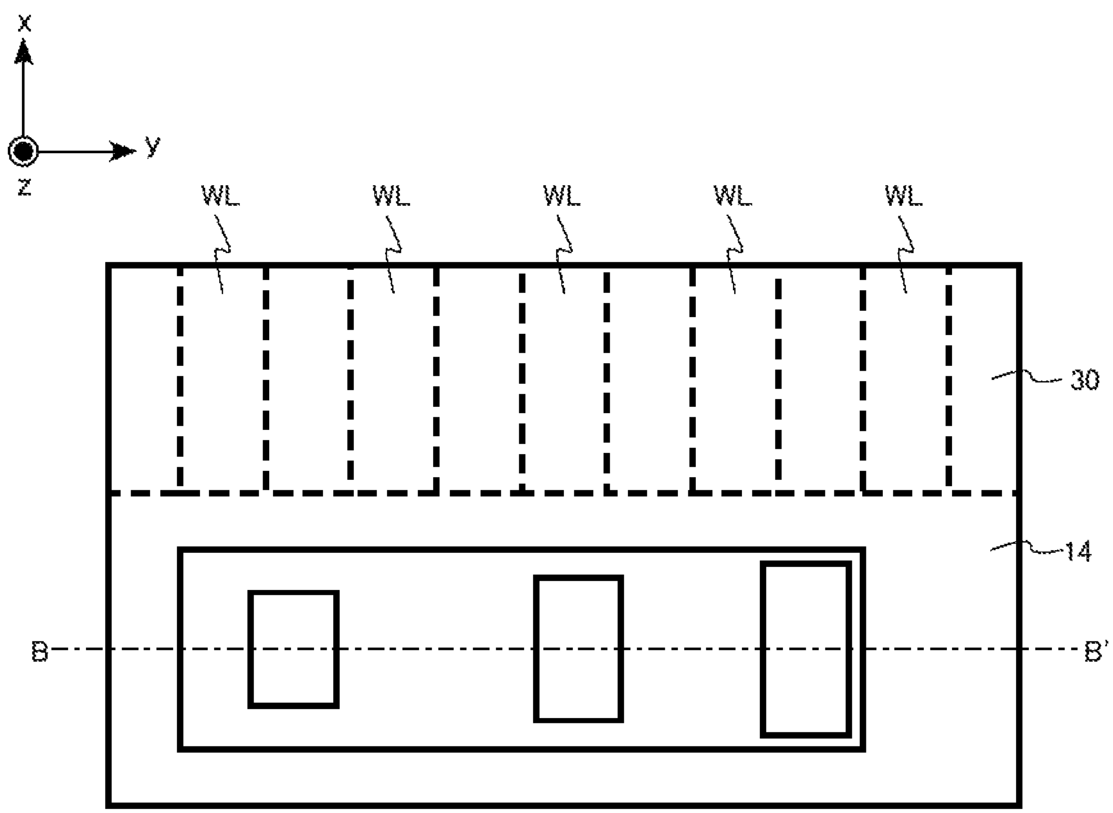
FIGS. 21A and 21B are diagrams schematically illustrating the memory device according to the comparative example that is being manufactured.
Figure 21B:
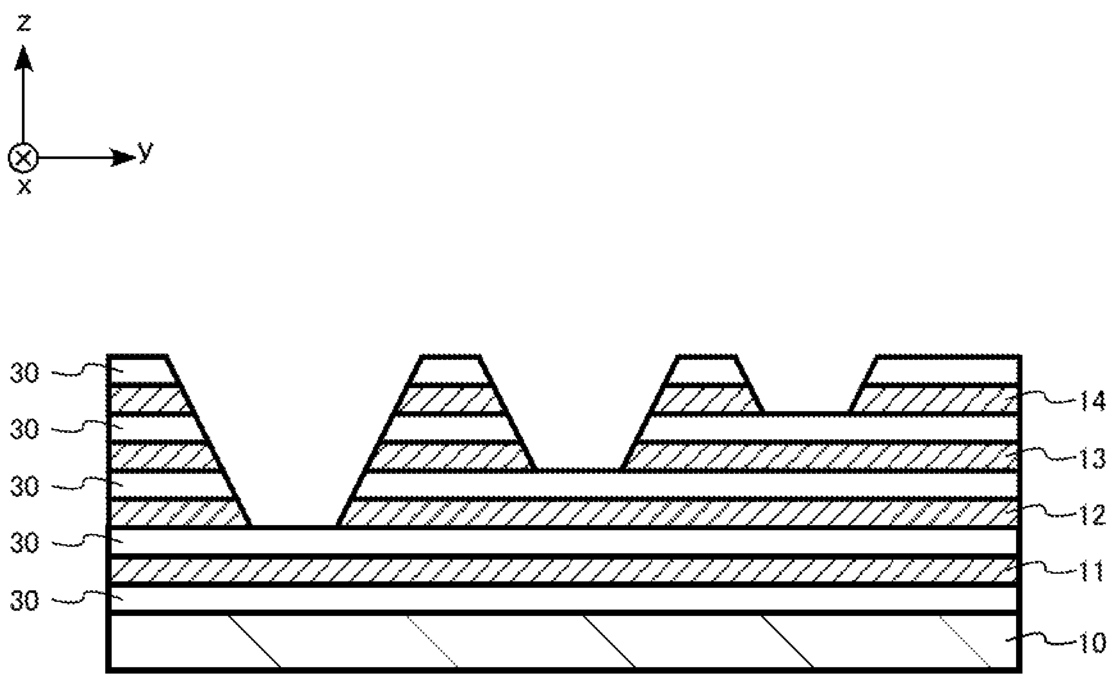

Then, the third mask member 53 and the first mask member 51 are removed (FIGS. 21A and 21B).

Then, the second insulating layer 40 is formed by the same method as that in the embodiment. In addition, a first contact hole 61, a second contact hole 62, a third contact hole 63, and a fourth contact hole 64 are formed in the second insulating layer 40. Then, the first contact electrode 21, the second contact electrode 22, the third contact electrode 23, and the fourth contact electrode 24 are formed.

The contact region according to the comparative example is formed by the above-mentioned manufacturing method.

The manufacturing method according to the comparative example can form the contact region, in which a plurality of contact electrodes with different depths are provided, with a small number of steps in a lithography method and an RIE method. This point is the same as that in the manufacturing method according to the embodiment.

Figure 22A:
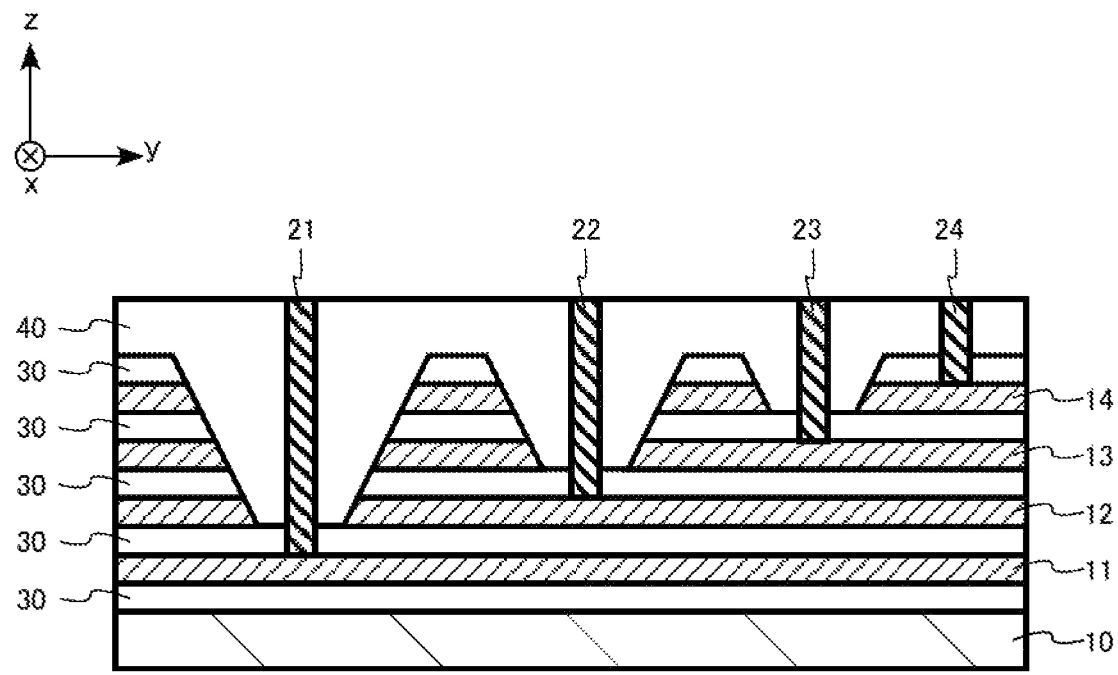
FIGS. 22A and 22B are diagrams illustrating the function and effect of the memory device according to the embodiment.
Figure 22B:
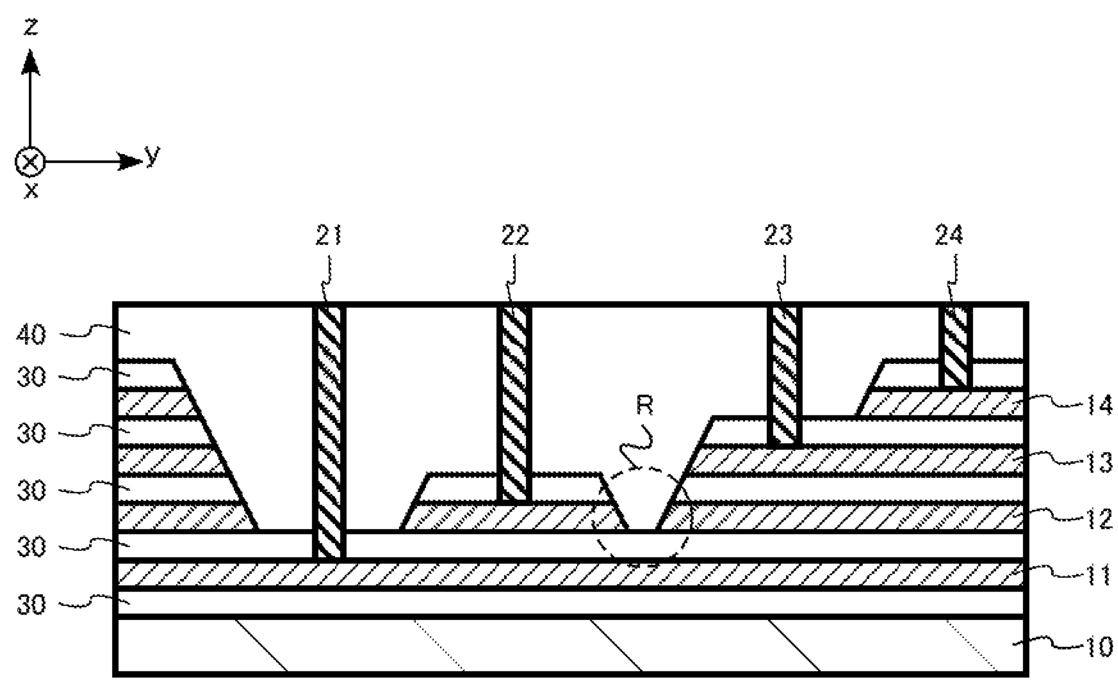

FIGS. 22A and 22B are diagrams illustrating the function and effect of the memory device according to the embodiment. FIG. 22A is a cross-sectional view schematically illustrating the contact region according to the comparative example. FIG. 22B is a cross-sectional view schematically illustrating the contact region 211 according to the embodiment.

In the case of the comparative example, the conductive layers are provided on both sides of each of the first contact electrode 21, the second contact electrode 22, and the third contact electrode 23. Therefore, in a case in which the area of the contact region is reduced, the distance between the contact electrode and the conductive layer is reduced and there is a concern that a short circuit will occur between the contact electrode and the conductive layer.

In the case of the embodiment, the conductive layers are arranged stepwise in one direction. Therefore, the conductive layer is provided on only one side of each of the second contact electrode 22 and the third contact electrode 23. With this configuration, the distance between the contact electrode and the conductive layer can be longer than that in the comparative example. As a result, it is possible to reduce the area of the contact region.

In the manufacturing method according to the embodiment, a single opening portion 50 is formed in the first mask member 51 unlike the comparative example in which a plurality of opening portions are formed. The pattern of the first mask member 51 makes it possible to form the conductive layers that are arranged stepwise in one direction with a small number of process steps similarly to the comparative example.

Figure 23:
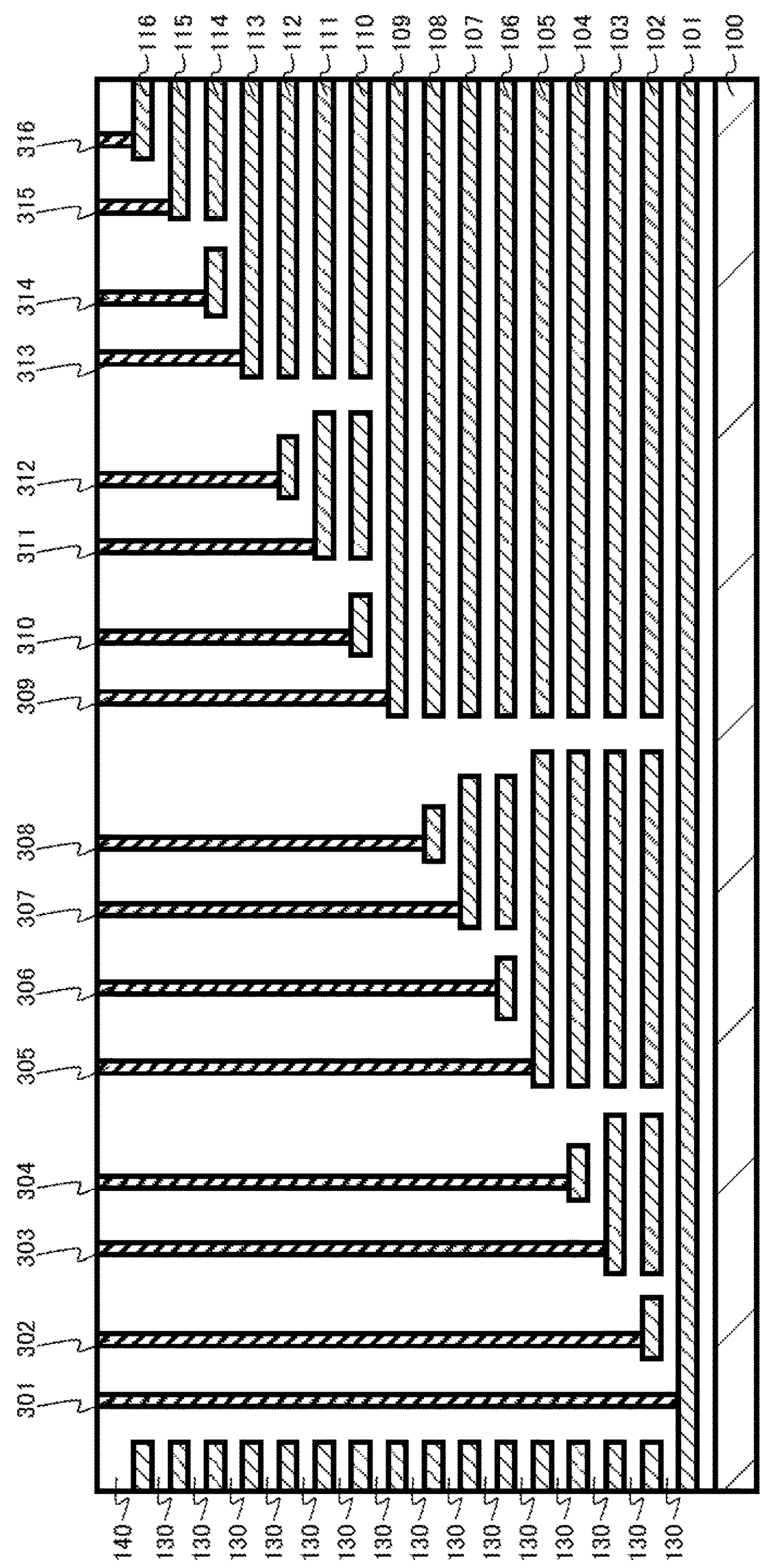
FIG. 23 is a cross-sectional view schematically illustrating a contact region according to a modification example.

FIG. 23 is a cross-sectional view schematically illustrating a contact region according to a modification example. FIG. 23 illustrates an example of a case in which 16 conductive layers are provided.

First to sixteenth conductive layers 101 to 116 are stacked on a substrate 100 with first insulating layers 130 interposed therebetween. Then, first to sixteenth contact electrodes 301 to 316 are formed in a second insulating layer 140.

In the case of the modification example, the conductive layers are arranged stepwise in one direction. Therefore, the conductive layer is provided on only one side of each of the second to fifteenth contact electrodes 302 to 315. As a result, it is possible to reduce the area of the contact region as in the embodiment.

Even in a case in which the number of conductive layers increases, it is possible to manufacture the structure in which the conductive layers are arranged stepwise in one direction by applying the same manufacturing method as that in the embodiment.

As described above, according to the memory device and the method for manufacturing the memory device of the embodiment, it is possible to provide a memory device that can reduce the area of a contact region.

In the embodiment, a case in which the contact electrodes are arranged in a direction (y direction) perpendicular to the extension direction (x direction) of the word lines WL has been described as an example. However, the contact electrodes may be arranged in a direction (x direction) parallel to the extension direction (x direction) of the word lines WL.

In the case of the resistive random access memory described in the embodiment, it is preferable that the contact electrodes be arranged in the direction (y direction) perpendicular to the extension direction (x direction) of the word lines WL. In other words, it is preferable that the contact region extend in the direction perpendicular to the extension direction of the word lines WL.

Since the resistive random access memory is a current-driven type, the influence of the wiring resistance of the word line WL on a memory operation is large. Therefore, the length of the word line WL is limited and the size of the memory cell array tends to be large in the y direction rather than in the x direction. For this reason, in a case in which the contact region extends in the y direction perpendicular to the extension direction of the word line WL, it is possible to effectively use a region in the chip and to reduce the area of the chip.

In the embodiment, a case in which the memory device is a resistive random access memory has been described as an example. However, the invention can be applied to other memory devices with a three-dimensional structure such as a three-dimensional NAND flash memory in which a NAND string extends in the z direction.

While certain embodiments have been described, these embodiments have been presented by way of example only, and are not intended to limit the scope of the inventions. Indeed, the memory device and the method for manufacturing the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:

a first conductive layer parallel to a first direction and a second direction perpendicular to the first direction;

a second conductive layer parallel to the first conductive layer, the second conductive layer being located in a third direction perpendicular to the first direction and the second direction with respect to the first conductive layer;

a third conductive layer parallel to the first conductive layer, the third conductive layer being located in the third direction with respect to the second conductive layer;

a fourth conductive layer parallel to the first conductive layer, the fourth conductive layer being located in the third direction with respect to the third conductive layer;

a first electrode extending in the third direction, the first electrode being connected to the first conductive layer;

a second electrode extending in the third direction, the second electrode being connected to the second conductive layer;

a third electrode extending in the third direction, the third electrode being connected to the third conductive layer, the second electrode being located between the first electrode and the third electrode; and a fourth electrode extending in the third direction, the fourth electrode being connected to the fourth conductive layer, the third electrode being located between the second electrode and the fourth electrode, wherein the third conductive layer and the fourth conductive layer are not provided between the first electrode and the second electrode, the fourth conductive layer is not provided between the second electrode and the third electrode, and a region without the second conductive layer is provided between the second electrode and the third electrode.

2. The memory device according to claim 1, wherein a length of the first electrode in the third direction is larger than a length of the second electrode, the length of the second electrode in the third direction is larger than a length of the third electrode, and the length of the third electrode in the third direction is larger than a length of the fourth electrode.

3. The memory device according to claim 1, further comprising:

a plurality of first conductive lines connected to one of the first conductive layer, the second conductive layer, the third conductive layer, and the fourth conductive layer, the first conductive lines extending in the first direction;

a plurality of second conductive lines extending in the third direction; and a plurality of resistance change layers provided between the plurality of first conductive lines and the plurality of second conductive lines.

4. The memory device according to claim 3, wherein the first electrode, the second electrode, the third electrode, and the fourth electrode are arranged in the second direction.

5. The memory device according to claim 3, further comprising:

a sense amplifier circuit connected to the plurality of second conductive lines.

6. The memory device according to claim 1, wherein the first conductive layer, the second conductive layer, the third conductive layer, and the fourth conductive layer have a plate shape.

7. The memory device according to claim 1, further comprising:

insulating layers provided between the first conductive layer and the second conductive layer, between the second conductive layer and the third conductive layer, and between the third conductive layer and the fourth conductive layer.

* * * * *